(12) United States Patent
Fujita

(10) Patent No.: US 8,177,954 B2
(45) Date of Patent: May 15, 2012

(54) PLATING PROCESSING METHOD, LIGHT-TRANSMITTING CONDUCTIVE FILM AND ELECTROMAGNETIC WAVE-SHIELDING FILM

(75) Inventor: Yoshihiro Fujita, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 1137 days.

(21) Appl. No.: 11/908,507

(22) PCT Filed: Mar. 14, 2006

(86) PCT No.: PCT/JP2006/305059
§ 371 (c)(1),
(2), (4) Date: Sep. 13, 2007

(87) PCT Pub. No.: WO2006/098338
PCT Pub. Date: Sep. 21, 2006

(65) Prior Publication Data
US 2009/0218127 A1 Sep. 3, 2009

(30) Foreign Application Priority Data
Mar. 15, 2005 (JP) ................................. 2005-073554

(51) Int. Cl.
*C25D 7/06* (2006.01)
(52) U.S. Cl. ........................................................ 205/138
(58) Field of Classification Search .................. 205/129, 205/138, 152
See application file for complete search history.

(56) References Cited

U.S. PATENT DOCUMENTS

| 3,567,595 | A * | 3/1971 | Yates .............................. 205/142 |
| 6,475,367 | B1 * | 11/2002 | Toyama et al. .................. 205/96 |
| 7,501,048 | B2 * | 3/2009 | Loermans et al. ............ 204/202 |
| 2004/0229028 | A1 * | 11/2004 | Sasaki et al. ................... 428/220 |
| 2008/0096044 | A1 * | 4/2008 | Matsumoto ..................... 428/623 |
| 2009/0020712 | A1 * | 1/2009 | Matsumoto ................ 250/515.1 |
| 2009/0065364 | A1 * | 3/2009 | Fujita .............................. 205/96 |

FOREIGN PATENT DOCUMENTS

| JP | 54-35832 A | 3/1979 |
| JP | 60-67698 A | 4/1985 |
| JP | 2003342787 A | 12/2003 |
| JP | 2004-59952 A | 2/2004 |
| JP | 2004-221564 A | 8/2004 |
| KR | 20020013914 A | 2/2002 |
| WO | 2004/007810 A1 | 1/2004 |

OTHER PUBLICATIONS

Japanese Office Action issued on Aug. 30, 2011 in the related Japanese Patent Application No. 2007-508168.
Communication dated Jan. 2, 2011 from the Korean Intellectual Property Office in counterpart Korean application No. 10-2007-7021204.

* cited by examiner

*Primary Examiner* — Luan Van
(74) *Attorney, Agent, or Firm* — Sughrue Mion, PLLC

(57) ABSTRACT

A plating processing method, which comprises continuously electroplating the surface of a film having a surface resistivity of from 1Ω/square to 1000Ω/square, wherein the transportation speed of the foregoing film is from 1 m/minute to 30 m/minute.

16 Claims, 1 Drawing Sheet

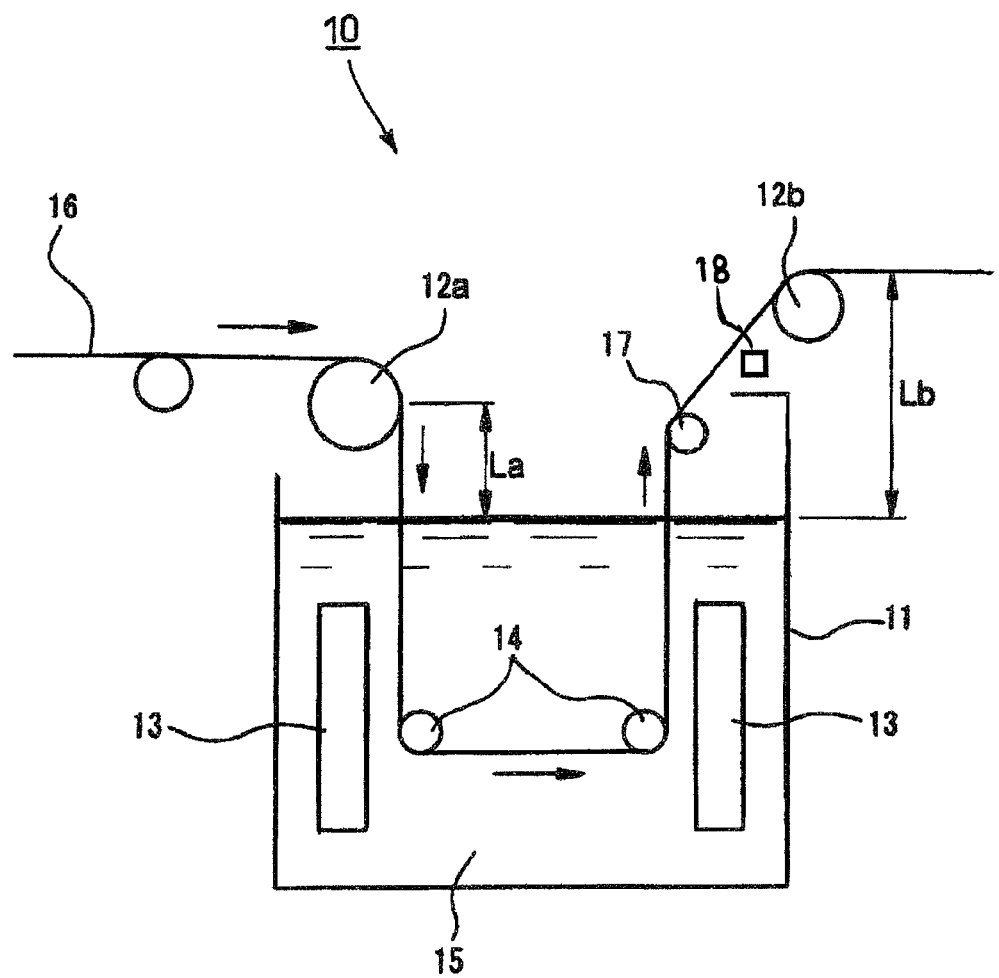

PLATING PROCESSING METHOD, LIGHT-TRANSMITTING CONDUCTIVE FILM AND ELECTROMAGNETIC WAVE-SHIELDING FILM

TECHNICAL FIELD

The present invention relates to a plating processing method, a light-transmitting conductive film and an electromagnetic wave-shielding film.

BACKGROUND ART

Recently, it has been demanded to develop an art for forming a metallic conductive film on an insulator film such as a flexible circuit board used in, for example, electronics, and an electromagnetic wave-shielding film used in plasma displays. Generally, for applying a metallic film thickly, an electroplating process is preferably employed in view of productivity, cost and easiness in controlling thickness. However, since a direct electroplating on an insulator film having a large surface resistivity cannot be effected, it is currently conducted that a thin metallic film is formed on an insulator film according to spattering method, vacuum deposition method or electroless plating method, thereafter electroplating is effected thereon to increase the thickness to a desired level.

For example, in patent document 1, a light-transmitting conductive film produced by utilizing a photosensitive material using a silver salt has excellent advantages such as a high transparency owing to its capability of precisely forming a fine line pattern and a mass production at a low cost compared with those according to other methods. However, in this film, a developed silver mesh has a high resistance and, therefore, an electroplating cannot be directly applied to the film. Thus, upon plating processing, the film requires a combination of electroless plating with electroplating.
Patent Document 1: JP-A-2004-221564

DISCLOSURE OF THE INVENTION

Problems that the Invention is to Solve

As described in the forgoing patent document 1, the combination of electroless plating with electroplating may arise problems such as a poor productivity and a high plating cost. These problems have been desired to be improved.

Further, in the foregoing patent document 1, the electroplating processing is conducted according to a batch-wise single wafer processing. When electroplating is applied to a film having a large surface resistivity of 1Ω/square or more according to a single wafer processing, in the area of the film contacting with a plating liquid, the portion located near to the side through which an electric current is passed is largely plated. Particularly, at the time of starting of plating, namely, at the initial electricity feeding, such phenomenon may occur and uniform plating is difficult to be achieved even by further continuing plating.

The present invention has been achieved in view of the foregoing problems. An object of the present invention is to provide a plating processing method capable of uniformly adhering plating even to a film having a high surface resistivity.

Another object of the present invention is to provide a light-transmitting conductive film and a light-transmitting electromagnetic wave-shielding film.

Means for Solving the Problems

According to the investigations by the present inventors, it could be found that when a continuous electroplating processing is applied to a film at a given film transportation speed, contrasting density in the film movement direction is sequentially relieved to be able to achieve uniform plating over the entire film surface as long as uniform adhesion is achieved in the direction lateral to the movement direction. Thus, the present invention reads as follows:

(1) A plating processing method, which comprises:
continuously electroplating a surface of a film having a surface resistivity of from 1Ω/square to 1000Ω/square,
wherein a transportation speed of the film is from 1 m/minute to 30 m/minute.

(2) The plating processing method as described in (1) above,
wherein the film is patterned with a silver mesh.

(3) The plating processing method as described in (2) above,
wherein the silver mesh is formed by a developed silver.

(4) A light-transmitting conductive film produced by a production method comprising the plating processing method as described in any of (1) to (3) above.

(5) A light-transmitting electromagnetic wave-shielding film, which comprises the light-transmitting conductive film as described in (4) above.

(6) The light-transmitting electromagnetic wave-shielding film as described in (5) above, which has an adhesive layer.

(7) The light-transmitting electromagnetic wave-shielding film as described in (5) or (6) above, which has a peelable protective film.

(8) The light-transmitting electromagnetic wave-shielding film as described in any of (5) to (7) above, which has a functional transparent layer having at least one function selected from the group consisting of infrared ray shielding property, hard coating property, antireflection property, antiglaring characteristic, antistatic property, antifouling property, ultraviolet ray cutting, property and gas barrier property.

(9) The light-transmitting electromagnetic wave-shielding film as described in any of (5) to (8) above, which has infrared ray shielding property.

(10) An optical filter, which comprises the light-transmitting electromagnetic wave-shielding film as described in any of (5) to (9) above.

(11) The processing method as described in any of (1) to (3) above, wherein a plurality of plating tanks are present, and the method comprises applying a washing process and a water-elimination process subsequent to completion of the processing in each plating tank.

Effect of the Invention

According to the plating processing method of the present invention, plating can be effectively uniformly applied to the front of a film only by electroplating. Thus, can be provided a light-transmitting conductive film and a light-transmitting electromagnetic wave-shielding film, each having uniform plating thereon at a high productivity.

BRIEF DESCRIPTION OF THE DRAWING

FIG. 1 A schematic drawing showing an exemplar embodiment of an electroplating tank suitably used in the plating processing method of the present invention.

DESCRIPTION OF THE REFERENCE NUMERALS AND SIGNS

10 electroplating tank
12a, 12b feeder roller
13 anode plate
16 film

BEST MODE FOR CARRYING OUT THE INVENTION

The mode for carrying out the plating processing method for the continuous electroplating according to the present invention will be described below by referring to the drawing. The apparatus for suitably conducting the plating processing according to the present invention, as in the known apparatuses, has such a construction that a film sequentially unreeled from a unreeling reel (not shown) around which the film is wound is fed to an electroplating tank, successively, the film having plating thereon is sequentially rolled up by a reel for rolling up (not shown).

An embodiment of an electroplating tank suitably used for the plating processing according to the present invention is shown in FIG. 1.

Electroplating tank 10 shown in FIG. 1 can apply a continuous plating processing to long film 16. The arrow indicates the transportation direction of film 16. Electric plating tank 10 is equipped with plating bath 11 for storing plating liquid 15. In plating bath 11, a pair of anode plates 13 are disposed in parallel. Inside anode plates 13, a pair of guide rollers 14 are rotatably disposed parallel to anode plates 13. Guide rollers 14 are movable in the perpendicular direction so that the plating processing time of film 16 can be controlled.

In the above of plating bath 11, a pair of feeder rollers (cathode) 12a, 12b which guide film 16 to plating bath 11 and supply electric current to film 16 are disposed in such a manner that they can rotate freely. In the above of plating bath 11, feeder roller 12b in the outlet side is disposed and liquid elimination roller 17 is rotatably disposed below feeder roller 12b. A spray for water washing 18 for eliminating plating liquid from the film is disposed between liquid elimination roller 17 and feeder roller 12b in the outlet side.

Anode plate 13 is connected with a plus terminal of an electric power unit (not shown) through an electric cable (not shown). Feeder rollers (cathode) 12a, 12b are connected with a minus terminal of the electric power unit (not shown).

In electroplating tank 10 described above, for example, in the case where the electroplating tank has a size of 10 cm×10 cm×10 cm to 100 cm×200 cm×300 cm, the distance between the lowest contacting part of feeder roller 12a in the inlet side with film 16 and the plating liquid (distance La shown in FIG. 1) is preferably from 0.5 cm to 15 cm, more preferably from 1 cm to 10 cm and further preferably from 1 cm to 7 cm. While, the distance between the lowest contacting part of feeder roller 12b in the outlet side with film 16 and the plating liquid (distance Lb shown in FIG. 1) is preferably from 0.5 cm to 25 cm, more preferably from 1.0 cm to 20 cm and further preferably from 1.0 cm to 15 cm.

A method for forming a mesh pattern copper plating of a film using the foregoing apparatus equipped with electroplating tank 10 will be described.

First, plating liquid 15 is stored in plating bath 11. Upon copper plating, as the plating liquid, a liquid containing 30 g/l to 300 g/l of copper sulfate pentahydrate and 30 g/l to 300 g/l of sulfuric acid can be used. In the case of nickel plating, a liquid containing nickel sulfate, nickel chloride or the like can be used. In the case of iron-silver plating, a liquid containing silver cyanide or the like can be used. To a plating liquid, additives such as a surfactant, a sulfur compound, an nitrogen compound and the like can be added.

Film 16 is set in such a state that it is wound around a supply reel (not shown) and film 16 is rolled up on a transportation roller (not shown) so that the surface of film 16 on which plating is to be formed may be contacted with feeder rollers 12a, 12b.

Voltage is applied to anode plate 13 and feeder rollers 12a and 12b and film 16 is transported with contacting with feeder rollers 12a and 12b. Film 16 is introduced into plating bath 11 to be dipped in plating liquid 15. Thus, copper plating is formed thereon. Upon passing through between liquid elimination rollers 17, plating liquid 15 adhered to film 16 is wiped off to be recovered in plating bath 11. This process is repeated in plural electroplating tanks, followed by final washing with water. The film is rolled up by a rolling up reel (not shown).

The transportation speed of film 16 is set to a range of from 1 m/minute to 30 m/minute. The transportation speed of film 16 is preferably in a range of from 1 m/minute to 10 m/minute, more preferably in a range of from 2 m/minute to 5 m/minute.

The number of the electroplating tank is not particularly limited. However, the number is preferably from 2 to 10, more preferably from 3 to 6.

A voltage to be applied is preferably from 1 to 100 V, more preferably from 2 to 60 V. In a case where plural electroplating tanks are disposed, a voltage to be applied to the electroplating tanks is preferably lowered in a stepwise manner. An amount of electric current in the inlet side of the first tank is preferably from 1 A to 30 A, more preferably from 2 A to 10 A.

Feeder rollers 12a, 12b are preferably contacted with the entire surface of the film (of the contacting area, the area substantially electrically contacting is 80% or more).

In the present invention, after processing in each plating tank, a water-washing or rinsing process is preferably employed to eliminate the adhered plating liquid.

The liquid of a layer to be plated or the water content therein is preferably eliminated within a time of from leaving of a film from the plating processing liquid surface of a plating bath to contacting with the subsequent cathode roll.

As a method for eliminating water, can be employed, for example, air knife, squeeze blade, water absorption roller and spraying of hot air. Further, can be preferably used an apparatus for spraying warming air or dehumidified air to the foregoing layer to be plated, a method for spraying warming air or dehumidified air to the foregoing layer to be plated in such a state that a heating roller is contacted with the back surface of the foregoing film, a method wherein warming air or dehumidified air is sprayed to the foregoing layer to be plated together while heated steam is sprayed to the back surface of the foregoing film.

A remaining water content after eliminating water is preferably 5 ml/m$^2$ or less, more preferably 3 ml/m$^2$ or less. Dried state is the most preferable. Namely, the remaining water content is 1 ml/m$^2$ or less.

Prior to effecting the plating processing in the foregoing electroplating tank, water washing and acid washing are preferably effected. As the processing solution to be used in the acid washing, those containing sulfuric acid or the like can be used.

The thickness of a conductive metal part to be plated by the foregoing plating processing, for an electromagnetic wave-shielding material of a display, is preferably thin because the thinner the thickness is, the wider in view angle a display has. Further, for use as a wiring material, conductive metal part is required to be thin for the request of attaining a high density.

From such point of view, a thickness of a layer comprising plated conductive metal is preferably less than 9 μm, more preferably from 0.1 μm to less than 5 μm, and further preferably from 0.1 μm to less than 3 μm.

In the plating processing of the present invention, when the surface resistivity of a film immediately before conducting the foregoing plating processing is from 1Ω/square to 1000Ω/square, the film may be subjected to electroless plating processing prior to the foregoing plating processing.

In case of effecting the electroless plating, known electroless plating techniques can be used. For example, an electroless plating technique used in a printed circuit board can be used. The electroless plating is preferably an electroless copper plating. As chemical species included in an electroless copper plating liquid, mention may be made of copper sulfate and copper chloride, as reducing agents, formalin and glyoxylic acid, as ligands of copper, EDTA, triethanolamine and the like, and as additives for stabilizing a bath and for improving smoothness of a plating film, polyethylene glycol, potassium ferrocyanide, bipyridine and the like.

A film applicable to the plating processing method of the present invention can be used as any film as long as it has a surface having a surface resistivity of from 1Ω/square to 1000Ω/square. For example, the film can be applied to a print wiring substrate formed on an insulator film, a light-transmitting conductive film used as an electromagnetic wave-shielding film for PDP and the like. The surface resistivity is preferably from 5Ω/square to 500Ω/square, more preferably from 10Ω/square to 1000Ω/square.

The conductive pattern on a film is preferably continued (electrically no breakage). It is enough that only a part of the pattern is connected. When the conductive pattern is broken, a portion having no plating or uneven plating is possibly formed in a first electroplating tank.

The plating processing method of the present invention is particularly preferably applied to an electromagnetic wave-shielding film comprising a light-transmitting conductive film patterned with a silver mesh formed by developed silver. As such a light-transmitting conductive film, those formed by exposing and developing a photosensitive material having an emulsion layer containing a silver salt emulsion on a transparent support are preferably used. The construction of this photosensitive material will be described below.

<Photosensitive Material>
[Emulsion Layer]

A photosensitive material to be used for the production of a light-transmitting conductive film preferably comprises, on the support, an emulsion layer containing a silver salt as a light sensor (silver salt-containing layer). The emulsion layer optionally can comprise, in addition to the silver salt, a dye, a binder, a solvent or the like.

(Dye)

In a photosensitive material, a dye can be included at least in an emulsion layer. The dye is included in the emulsion layer as a filter dye or for the prevention of irradiation and for other various purposes. As the foregoing dye, a solid disperse dye may be included. As preferably used dyes, mention may be made of dyes represented by general formulae (FA), (FA1), (FA2) and (FA3) described in JP-A-9-179243. Specifically, compounds F1 to F34 described in the same publication are preferable. Compounds (II-2) to (II-24) described in JP-A-7152112, compounds (III-5) to (III-18) described in JP-A-7-152112, and Compounds (IV-2) to (IV-7) described in JP-A-7-152112 and the like are also preferably used.

As other usable dyes, mention may be made of cyanine dyes, pyryrium dyes and aluminum dyes, which are described in JP-A-3-138640, as solid fine-particulate disperse dyes which are decolored upon developing or fixing processing. As dyes which are not decolored upon processing, mention may be made of cyanine dyes having a carboxyl group described in JP-A-9-96891, cyanine dyes having no acidic groups described in JP-A-8-245902, and lake cyanine dyes described in JP-A-8-333519, cyanine dyes described in JP-A-1-266536, holopolar cyanine dyes described in JP-A-3-136038, pyryrium dyes described in JP-A-62-299959, polymer cyanine dyes described in JP-A-7-253639, solid fine-particulate disperse products of oxonol dyes described in JP-A-2-282244, light scattering particles described in JP-A-63-131135, Tb3+compound described in JP-A-9-5913, ITO powder described in JP-A-7-113072, and the like. Further, dyes represented by general formulae (F1) and (F2) described in JP-A-9-179243, specifically, compounds F35 to F112 described in the same publication also can be used.

The foregoing dyes can comprise water-soluble dyes. As such a water-soluble dye, mention may be made of oxonol dyes, benzylidene dyes, merocyanine dyes, cyanine dyes and azo dyes. Of these dyes, oxonol dyes, hemioxonol dyes and benzylidene dyes are useful. As specific examples of the water-soluble dye, mention may be made of those described in U.K. patent Nos. 584,609 and 1,177,429; JP-A-48-85130, JP-A-49-99620, JP-A-49-114420, JP-A-52-20822, JP-A-59-154439 and JP-A-59-208548; U.S. Pat. Nos. 2,274,782, 2,533,472, 2,956,879, 3,148,187, 3,177,078, 3,247,127, 3,540,887, 3,575,704, 3,653,905 and 3,718,427.

The content of a dye in the foregoing emulsion layer is preferably 0.01 to 10% by mass, more preferably 0.1 to 5% by mass based on the total solid content in view of the effect of the prevention of irradiation and the sensitivity decrease due to the increase in the addition amount of the dye.

(Silver Salt Emulsion)

As a silver salt emulsion, inorganic silver salts such as a silver halide and organic silver salts such as silver acetate can be mentioned. A silver halide emulsion excellent in properties as light sensor is preferably used. A technique related to a silver halide used in a silver salt photographic film and printing paper, a film for printing plate making, an emulsion mask for photomasking and the like also can be used in the present invention.

A halogen element included in the foregoing silver halide can be any one of chlorine, bromine, iodine and fluorine. These elements also can be used in combination. For example, a silver halide mainly comprising AgCl, AgBr or AgI is preferably used. More preferably, a silver halide mainly comprising AgBr or AgCl is used. Further, silver chlorobromide, silver iodochlorobromide, and silver iodobromide are also preferably used. Silver chlorobromide, silver bromide, silver iodochlorobromide, and silver iodobromide are more preferably used. Silver chlorobromide and silver iodochlorobromide, which comprise 50 mol % or more of silver chloride, are most preferably used.

"A silver halide mainly comprising AgBr (silver bromide)" herein means a silver halide wherein a molar fraction of a bromide ion in a silver halide composition is 50% or more. The silver halide particles mainly comprising AgBr may include, in addition to a bromide ion, an iodide ion and a chloride ion.

A silver halide is a solid particulate. An average particle size of the silver halide is preferably 0.1 nm to 1000 nm (1 μm), more preferably 0.1 nm to 100 nm (1 μm), and further preferably 1 nm to 50 nm, in terms of a diameter equivalent to sphere, in view of an image quality of a patterned metal silver layer formed after exposure and development process.

It should be noted that the diameter equivalent to sphere of the silver halide particle means the diameter of a spherical particle having the same volume as that of the silver halide particle.

The shape of the silver halide particle is not particularly limited. For example, the silver halide particle can be spherical, cubic, tabular (hexagonal tabular, triangular tabular, rectangular tabular, and the like), octahedral, and tetradecahedral, preferably cubic and tetradecahedral.

The silver halide particle can be consisted of a uniform phase or different phases in its internal part and surface layer. The particle also may comprise a localized layer having a different halogen composition in the internal part or the surface of the particle.

The silver halide emulsion which is a coating liquid for an emulsion layer can be prepared by respective methods described in P. Glafkides, Chimie et Physique Photographique published by Paul Montel, 1967, G. F. Dufin, Photographic Emulsion Chemistry published by The Forcal Press, 1966, V. L. Zelikan et al, Making and Coating Photographic Emulsion Published by The Forcal Press, 1964, and the like.

The foregoing preparation method of a silver halide emulsion can be any one of an acidic method, a neutral method and the like. As a method for reacting a soluble silver salt with a soluble halide salt, a one side mixing method, a simultaneous mixing method, a combination thereof or the like can be employed.

As a method for forming silver particles, a method wherein the particles are formed in the presence of an excessive amount of silver ion (so-called a reverse mixing method). As an embodiment of the simultaneous mixing method, also can be used a method for keeping pAg in a liquid phase constant wherein a silver halide is generated, namely, so-called a controlled double jet method.

A so-called silver halide solvent such as ammonia, thioether, tetra-substituted thiourea or the like can be preferably used to form particles. More preferably a tetra-substituted thiourea compound is used in the formation of the particle, which is described in JP-A-53-82408 and JP-A-55-77737.

As a preferable thiourea compound, tetramethylthio urea, 1,3-dimethyl-2-imidazolidine thion can be mentioned. An amount of a silver halide solvent to be added differs depending upon a kind, a desired particle size and a halogen composition of a compound to be used. However, it is preferably $10^{-5}$ to $10^{-2}$ mol per 1 mol of a silver halide.

The foregoing controlled double jet method and particle formation method using a silver halide solvent can readily prepare a silver halide emulsion having a regular crystal form and a narrow particle size distribution. Thus, these methods can be preferably used.

In order to make a silver particle size uniform, silver is preferably made to be rapidly grown in a range not exceeding critical saturation degree using a method wherein an addition rate of silver nitrate or an alkali halide is varied depending upon a particle grown rate as described in U.K. Patent 1,535,016, JP-B-48-36890 or JP-B-52-16364 or using a method of changing a concentration of an aqueous solution as described in U.K. Patent 4,242,445 or JP-A-55-158124. A silver halide emulsion used for the formation of an emulsion layer is preferably a mono-disperse emulsion. It preferably has a variation coefficient of 20% or less, more preferably 15% or less and the most preferably 10% or less. The variation coefficient is represented by {(standard deviation of particle size)/(average particle size)}×100.

As the silver halide emulsion, a mixture of plural kinds of silver halide emulsion each having a different particle size from each other can be used.

The silver halide emulsion can comprise a metal belonging to VIII group or VIIB group of the periodic table. Particularly, for achieving a high contrast and a low blushing, the silver halide emulsion preferably comprises rhodium compounds, iridium compounds, ruthenium compounds, iron compounds, osmium compounds and the like. These compounds can comprise various kinds of ligands. Examples of the ligand include a cyanide ion, halogen ion, a Thiocyanate ion, a nitosyl ion, water, a hydroxide ion, and the like. The example further comprises in addition to these pseudohalides and ammonia, organic molecules such as amines (methylaine, ethylamine and the like), heterocyclic compounds (imidazole, Thiazole, 5-methylthiazole, mercaptoimidazole and the like), urea, thiourea and the like.

For higher sensitization, doping of hexacyanide metal complexes such as $K_4$—$[Fe(CN)_6]$, $K_4$—$[Ru(CN)_6]$ or $K_3$—$[Cr(CN)_6]$ is advantageously effected.

As the foregoing rhodium compound, a water-soluble rhodium compound can be used. As the water-soluble rhodium compound, mention may be made of rhodium halide (III) compounds, hexachlororhodium (III) complex salts, pentachloroaquorhodium complex salts, tetrachloroaquorhodium complex salts, hexabromorhodium (III) complex salts, hexaaminerhodium (III) complex salts, trizalatorhodium (III) complex salts, $K_3Rh_2Br_9$ and the like.

These rhodium compounds are dissolved in water or an appropriate solvent and used. A method which is currently frequently used for stabilizing a solution of a rhodium compound, namely, a method wherein an aqueous solution of a hydrogen halide (e.g., hydrochloric acid, bromic acid, fluoric acid, and the like) or an alkali halide (e.g., KCl, NaCl, KBr, NaBr and the like) is added can be used. Instead of using a water-soluble rhodium, additional silver halide particles having rhodium previously doped thereon can be added upon preparation of a silver halide so that rhodium may be dissolved.

As the foregoing iridium compound, hexachloroiridium complex salts such as $K_2IrCl_6$, $K_3IrCl_6$ and the like, hexabromoiridium complex salts, hexaamineiridium complex salts, pentachloronitrosyliridium complex salts and the like can be mentioned.

As the foregoing ruthenium compound, hexachlororuthenium, pentachloronitrosylruthenium, $K_4$—$[Ru(CN)_6]$ and the like can be mentioned.

As the foregoing iron compound, potassium hexacyanoferrate (III) and ferrous thiocyanate can be mentioned.

The foregoing ruthenium or osmium is added in the form of a water-soluble complex salt as described in JP-A-63-2042, JP-A-1-285941, JP-A-2-20852, JP-A-2-20855. As the particularly preferable example, a heptacoordinate complex shown by the following formula can be mentioned.

$$[ML_6]^{-n}$$

(In the formula, M represents Ru or Os, and n represents 1, 2, 3 or 4.).

In this case, a counter ion has no significance. For example an ammonium or alkali metal ion is used. As preferable ligands, mention may be made of a halide ligand, a cyanide ligand, a cyan oxide ligand, a nitrosyl ligand, a thionitrosyl ligand, and the like. Specific examples of the complex are shown below. However, the present invention is not limited thereto.

$[RuCl_6]^{-3}$, $[RuCl_{14}H_2O_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[OS(NO)(CN)_5]^{-2}$, $[Os(NS)Br_5]^{-2}$, $[Os(CN)_6]^{-4}$, $[Os(O)_2(CN)_5]^{-4}$

An addition amount of these compounds is preferably from $10^{-10}$ mol to $10^{-2}$ mol/mol Ag, more preferably from $10^{-9}$ mol to $10^{-3}$ mol/mol Ag.

Additionally, a silver halide containing Pd(II) ion and/or Pd metal can be preferably used. Pd can be uniformly distributed in a silver halide particle. However, it is preferably included in the vicinity of a surface layer of the silver halide particle. The description "Pd is included in the vicinity of a surface layer of the silver halide particle" means that the silver halide particle has a layer having a higher palladium content than those of other layers in an area from the surface thereof to 50 nm in the depth direction.

Such a silver halide particle can be prepared by adding Pd in the course of forming the silver halide particle. After adding 50% or more of a silver ion and a halogen ion based on the respective total addition amounts, Pd is preferably added. It is also preferable that Pd is made to be present on the silver halide surface layer according to a method wherein Pd(II) ion is added upon post-ripening.

This Pd-containing silver halide particle accelerates physical phenomena and an electroless plating speed, and raises the production efficiency of a desired electromagnetic shield material to contribute to the reduction of the production cost. Pd has been well-known and used as an electroless plating catalyst. Pd can be locally present on the surface layer of the silver halide particle so that Pd, which is extremely expensive, can be saved.

A content of Pd ion and/or Pd metal included in a silver halide is preferably from $10^{-4}$ mol to 0.5 mol/mol Ag, more preferably from 0.01 mol to 0.3 mol/mol Ag.

Examples of a Pd compound to be used include $PdCl_4$ and $Na_2PdCl_4$.

Further, in order to improve the sensitivity as a light sensor, a chemical sensitization effected in a photographic emulsion can be applied to a silver halide particle. As the method of the chemical sensitization, can be employed chalcogen sensitization such as sulfur sensitization, selenium sensitization and tellurium sensitization, precious metal sensitization such as gold sensitization, and reduction sensitization. These chemical sensitization methods can be used alone or in combination. In a case where the foregoing chemical sensitization methods are used in combination, for example, a combination of a sulfur sensitization method with a gold sensitization method, a combination of a sulfur sensitization method, a selenium sensitization method and a gold sensitization method, and a combination of a sulfur sensitization method, a tellurium sensitization method and a gold sensitization method are preferable.

The foregoing sulfur sensitization is generally effected by adding a sulfur sensitizer to an emulsion, followed by stirring at a high temperature of 40° C. or more for a given length of time. As the foregoing sulfur sensitizer, known compounds can be used. For example, a sulfur compound included in gelatin, and various sulfur compounds such as a thiosulfate, a thiourea, a thiazole and a rhodanine can be used. Preferable sulfur compounds are thiosulfates and thiourea compounds. An addition amount of a sulfur sensitizer varies under various conditions such as pH upon chemical ripening, temperature and size of a silver halide particle. The amount is preferably from $10^{-7}$ to $10^{-2}$ mol, more preferably from $10^{-5}$ to $10^{-3}$ mol per 1 mol of a silver halide.

As a selenium sensitizer to be used in the foregoing selenium sensitization, a known selenium compound can be used. The foregoing selenium sensitization is generally effected by adding an unstable and/or a non-unstable selenium compound to an emulsion, followed by stirring at a high temperature of 40° C. or more for a given length of time. As the foregoing unstable selenium compound, those described in JP-B-44-15748, JP-B-43-13489, JP-A-4-109240, JP-A-4-324855 and the like can be used. Particularly, compounds shown by general formulae (VIII) and (IX) described in JP-A-4-324855 can be preferably used.

Tellurium sensitizers to be used in the foregoing tellurium sensitization are compounds capable of forming silver tellurate, which is presumed to be a sensitization core, on the surface or the inside of a silver halide particle. A formation rate of silver tellurate in a silver halide emulsion can be tested according to the method described in JP-B-5-313284. Specifically, compounds described in U.S. Pat. Nos. 1,623,499, 3,320,069 and 3,772,031; U.K. Patent Nos. 235,211, 1,21, 496, 1,295,462 and 1,396,696; Canada Patent No. 800,958; JP-A-4-204640, JP-A-4-271341, JP-A-4-333043 and JP-A-5-303157; J. Chem. Soc. Chem. Commun.) 635 (1980), ibid 1102 (1979), ibid 645 (1979), J. Chem. Soc. Perkin, Trans.) 1,2191 (1980); The Chemistry of Organic Selenium and Tellunium Compounds, vol 1, (1986) edited by S. Patai, and The Chemistry of Organic Selenium and Tellunium Compounds, vol. 12, (1987) edited by S. Patai can be used. Particularly, compounds represented by general formulae (II), (III) and (IV) described in JP-A-5-313284 are preferable.

An amount to be used of a selenium sensitizer or a tellurium sensitizer varies depending upon a silver halide particle used, chemical ripening conditions, and the like. The amount is around from $10^{-8}$ to $10^{-2}$ mol, preferably from $10^7$ to $10^{-3}$ mol per 1 mol of a silver halide. Conditions of a chemical sensitization are not particularly limited. However, pH is from 5 to 8, pAg is from 6 to 11, preferably from 7 to 10, and temperature is from 40 to 95° C., preferably from 45 to 85° C.

As the foregoing precious metal sensitizer, gold, platinum, palladium, iridium and the like can be mentioned. Particularly, gold sensitization is preferable. As the gold sensitizer to be used for gold sensitization, specifically mention may be made of chlorauric acid, potassium chloroaurate, potassium aurithiocyanate, auric sulfide, gold (I) thioglucose, gold (I) thiomannose and the like. They can be used in an amount of about from $10^{-7}$ to $10^{-2}$ mol per 1 mol of a silver halide. A cadmium salt, a sulfite, a lead salt, a thallium salt and the like can be coexistent with a silver halide emulsion in the course of the formation or the physical ripening of a silver halide particle.

A reduction sensitization can be applied to a silver salt emulsion. As a reduction sensitizer, a stannous salt, an amine, formamidinesulfinic acid, a silane compound and the like can be used.

To the foregoing silver halide emulsion can be added a thiosulfonic acid compound according to the method described in European Laid-Open Patent (EP) No. 293917. A silver halide emulsion to be used in the preparation of a photosensitive material can be used alone. Alternatively, two or more kinds of silver halide emulsions, which are differed in, for example, average particle size, halogen composition, crystal habit, chemical sensitization conditions and sensitivity, can be used in combination. In particular, in order to achieve a high contrast, as described in JP-A-6-324426, it is preferable that the nearer to a support an emulsion is coated, the higher sensitivity the emulsion has.

(Binder)

In an emulsion layer, a binder can be used for the purpose of uniformly dispersing a silver salt particle and of assisting an adhesion between an emulsion layer and a support. As the foregoing binder, either of a water-insoluble polymer or a water-soluble polymer can be used. However, the water-soluble polymer preferably can be used.

As the foregoing binder, for example, mention may be made of gelatin, polyvinyl alcohol (PVA), polyvinyl pyrrolidone (PVP), polysaccharides such as starch, cellulose and the derivatives thereof, polyethylene oxide, polysaccharides, polyvinyl amine, chitosan, polylysine, polyacrylic acid, polyalginic acid, polyhyaluronic acid carboxycellulose and the like.

These binders respectively have a neutral, anionic or cationic property depending upon an ionicity of the functional group thereof.

A content of a binder to be included in an emulsion layer is not particularly limited, and can be optionally determined in such a range that the binder can exhibit desirable dispersibility and adhesiveness.

(Solvent)

A solvent to be used for the formation of the foregoing emulsion layer is not particularly limited. Examples of the solvent include water, an organic solvent (e.g., alcohols such as methanol, ketones such as acetone, an amide such as formamide, a sulfoxide such as dimethyl sulfoxide, an ester such as ethyl acetate, an ether and the like), an ionic liquid, and a mixed solvent thereof.

A content of the solvent is 30 to 90% by mass, preferably 50 to 80% by mass on the basis of the sum of the mass of a silver salt, a binder and the like included in the foregoing emulsion layer.

[Transparent Support]

As a transparent support to be used for a photosensitive material, plastic film, plastic plate, glass plate and the like can be used.

As raw materials of the foregoing plastic film and plastic plate, for example, polyesters such as polyethylene terephthalate (PET) and polyethylene naphthalate; polyolefins such as polyethylene (PE), polypropylene (PP), polystyrene and EVA; vinyl resins such as polyvinyl chloride and polyvinylidene chloride; and other materials, i.e., polyetherether ketone (PEEK), polysulfone (PSF), polyether sulfone (PES), polycarbonate (PC), polyamide, polyimide, acrylic resin, triacetylcellulose (TAC) and the like can be used.

In view of transparency, heat resistance, easiness in handling and cost, the foregoing plastic film is preferably polyethylene terephthalate film.

An electromagnetic wave-shielding film for a display is required to be transparent. Thus, a support is desirably highly transparent. The plastic film or the plastic plate in this case has a transmittance of all visible light of preferably from 70 to 100%, more preferably from 85 to 100%, and particularly preferably from 90 to 100%. As the foregoing plastic film or plastic plate, those colored in such an extent that the object of the present invention is not impeded also can be used.

The plastic film or plastic plate can be used as a single layer or as a multi-layered film comprising two or more thereof in combination.

The thickness of a transparent support is preferably from 200 μM or less, more preferably from 20 to 180 μm, and the most preferably from 50 to 120 μm.

In a case where a glass plate is used as the transparent support, the kind of the glass is not particularly limited. However, in a case where the glass plate is used for an electromagnetic wave-shielding film of a display, the glass plate is preferably a reinforced glass having a reinforcing layer on its surface. The reinforced glass has a high possibility of preventing breakage compared with a glass having been subjected to no reinforcing treatment. Further, in a reinforced glass to be obtained by air-cooling method, if it were to be broken, its crushed fragment is small and its end face cannot be sharp. Thus, such a glass is preferable in view of safety.

[Protective Layer]

In a photosensitive material to be used, a protective layer can be provided on a later-described emulsion layer. "The protective layer" in the present invention means a layer comprising a binder such as gelatin or a high molecular polymer. The protective layer is formed on an emulsion layer having photosensitivity for preventing scratches and for exhibiting effects for improving mechanical characteristics. The foregoing protective layer is preferably not provided in case of effecting plating processing. Even if it is provided, it is preferably thin. The thickness is preferably 0.2 μm or less. The coating method of the foregoing protective layer is not particularly limited and a known coating method can be optionally selected.

[Exposure]

In order to form a light-transmitting conductive film, exposure is effected to such a photosensitive material comprising a transparent support having an emulsion layer comprising a silver salt emulsion provided thereon as described above. Exposure can be effected using electromagnetic wave. As the electromagnetic wave, for example, lights such as visible ray and ultraviolet ray, and radiation rays such as X ray can be mentioned. Further, for effecting exposure, a light source having a wavelength distribution also can be utilized, and also a light source having a specified wavelength can be used.

As the foregoing light source, various illuminants emitting light in visible spectrum region are used depending upon a necessity. For example, a red illuminant, a green illuminant and a blue illuminant are used alone or as a mixture of two or more kinds thereof. The spectral region is not limited to the foregoing red, green and blue, and fluorescent materials emitting light in a region of yellow, orange or purple, or infrared region are also used. Particularly, a cathode-ray tube emitting white by mixing these illuminants is often used. An ultraviolet lamp is also preferable, and g-ray and i-ray of a mercury lamp, and the like are also utilized.

Exposure is preferably effected using various kinds of laser beam. For example, a scanning exposure system using a monochromatic high density light such as gas laser, luminescent diode, semiconductor laser, a second higher harmonic wave luminescent light source (SHG) comprising a combination of a solid laser using semiconductor laser or using, as an excitation light source, semiconductor laser with a nonlinear optical crystal can be preferably used. Further, KrF excimer laser, ArF excimer laser, F2 laser and the like also can be used. In order to make the system compact and cheap, exposure is preferably effected using semiconductor laser or a second higher harmonic wave luminescent light source (SHG) comprising a combination of a solid laser with a non-linear optical crystal. Particularly, in order to design a device which is compact, cheap, long in life and highly stable, exposure is most preferably effected using semiconductor laser.

An exposure energy is preferably 1 mJ/cm$^2$ or less, more preferably 100 mJ/cm or less, and further preferably 50 mJ/cm$^2$ or less.

As a laser light source, specifically, blue semiconductor laser having a wavelength of from 430 nm to 460 nm published by Nichia Kagaku K.K. in 48$^{th}$ Lecture of Union related to Applied Physics, held in March, 2001), green laser having a wavelength of about 530 nm obtained by converting the wavelength of semiconductor laser having oscillation wavelength of about 1060 nm with SHG crystal of LiNbO$_3$ having an inverted domain structure in the form of waveguide, red semiconductor laser having a wavelength of about 685 nm (Hitachi, Type No. HL6738MG), red semiconductor laser having a wavelength of about 650 nm (Hitachi, Type No. HL6501MG), and the like can be preferably used.

As a method for exposing a silver salt-containing layer to form a pattern, scanning exposure using laser beam is preferable. Particularly, a capstan laser scanning exposure device described in JP-A-2000-39677 is preferably used. In the foregoing capstan laser scanning exposure device, instead of beam scanning by Polygon mirror rotation, DMD described in JP-A-2004-1244 is preferably used for the light beam scanning system.

[Development Process]

After exposing an emulsion layer, development process is further effected. In the development process, common techniques in development process used for a silver salt photographic film and printing paper, a film for printing plate making, an emulsion mask for photomasking, and the like can be used. A developer to be used is not particularly limited. However, PQ developer, MQ developer, MAA developer and the like can be used. As commercially available products, for example, developers such as CN-16, CR-56, CP45X, FD-3 and Papitol produced by Fujifilm corporation; C-41, E-6, RA-4, D-19 and D-72 produced by Kodak K. K.; and developers included in the kit can be used. Further, lith developer also can be used.

As the lith developer, D85 produced by Kodak K.K. and the like can be used. By effecting the foregoing exposure and development process, a metal silver part, preferably patterned metal silver part is formed in an exposed part, and in an unexposed part, an optically transparent part which will be described below is formed.

As the foregoing developer, a dihydroxybenzene-based developing agent can be used. Examples of the dihydroxybenzene-based developing agent include hydroquinone, chlorohydroquinone, isopropylhydroquinone, methylhydroquinone, hydroquinonemonosulfonate and the like, particularly preferably hydroquinone. As the foregoing dihydroxybenzene-based developing agent and an assisting developing agent showing a super additivity, 1-phenyl-3-pirazolidones and p-aminophenols can be mentioned. As the developer, preferably can be used a combination of a dihydroxybenzene-based developing agent with a 1-phenyl-3-prazolidone and a combination of a dihydroxybenzene-based developing agent with a p-aminophenol.

As a 1-phenyl-3-pirazolidone to be used as the assisting developing agent or as a developing agent used in combination with a derivative of the 1-phenyl-3-pirazolidone, specifically, mention may be made of 1-phenyl-3-pirazolidone, 1-phenyl-4,4-dimethyl-3-pirazolidone, 1-phenyl-4-methyl-4-hydroxymethyl-3-pirazolidone and the like.

As the foregoing p-aminophenol-based assisting developing agent, mention may be made of N-methyl-p-aminophenol, p-aminophenol, N-(β-hydroxyethyl)-p-aminophenol, N-(4-hydroxyphenyl)glycine and the like. In particular, N-methyl-p-aminophenol is preferable. The hydroxybenzene-based developing agent generally is used in an amount of preferably from 0.05 mol/liter to 0.8 mol/liter, particularly preferably 0.23 mol/liter or more, and further preferably from 0.23 mol/liter to 0.6 mol/liter. While, in a case where a combination of a dihydroxybenzene with a 1-phenyl-3-pirazolidone or a p-aminophenol is used, the former is used in an amount of preferably from 0.23 mol/liter to 0.6 mol/liter, more preferably from 0.23 mol/liter to 0.5 mol/liter, and the latter is used in an amount of 0.06 mol/liter or less, more preferably from 0.03 mol/liter to 0.003 mol/liter.

A developing initiating liquid and a developing replenishing liquid each preferably have a property of "causing 0.5 or less of pH elevation upon adding 0.1 mol of sodium hydroxide to 1 l of the respective foregoing liquids. A method for confirming the developing initiating liquid or the developing replenishing liquid to be used has such a property comprises adjusting pH of the developing initiating liquid or the developing replenishing liquid to 10.5, then adding 0.1 mol of sodium hydroxide to 1 liter of the respective liquids, successively determining pH of the respective liquids. When the elevation of pH of the liquids is 0.5 or less, it can be judged that the respective liquids have the property as prescribed above. Particularly, it is preferable to use a developing initiating liquid and a developing replenishing liquid each showing pH elevation of 0.4 or less upon effecting the foregoing test.

A method for giving the foregoing property to a developing initiating liquid and a developing replenishing liquid is preferably one using a buffer. As the foregoing buffer, carbonates, boric acid described in JP-A-62-186259, saccharides (e.g., saccharose) described in JP-A-60-93433, oximes (e.g., acetoxime), phenols (e.g., 5-sufosalycylic acid), phosphates (e.g., sodium salt, potassium salt) and the like, preferably carbonates and boric acid can be used. An amount of the foregoing buffer (particularly, carbonate) is used in an amount of preferably 0.25 mol/liter or more, particularly preferably from 0.25 mol/liter to 1.5 mol/liter.

The foregoing developing initiating liquid has a pH of preferably from 9.0 to 11.0, particularly preferably from 9.5 to 10.7. The pH of the foregoing developing replenishing liquid and a pH of a developer in a developing tank in continuous processing also reside in the foregoing range. As an alkaline chemical used for adjusting pH, commonly used water-soluble inorganic alkali metal salts (e.g., sodium hydroxide, potassium hydroxide, sodium carbonate, potassium carbonate) can be used.

When 1 square meter of a photosensitive material is processed, a content of a developing replenishing liquid in a developer is preferably 323 ml or less, more preferably from 323 to 30 ml, and further preferably from 225 to 50 ml.

A developing replenishing liquid may have the same composition as that of a developing initiating liquid, and, regarding a component to be consumed by development, may have a higher concentration than the developing initiating liquid.

A developer in processing a photosensitive material (hereinafter, developing initiating liquid and developing replenishing liquid are sometimes collectively called "developer") can comprise commonly used additives (e.g., preservative, chelating agent). As the foregoing preservative, mention may be made of sulfites such ad sodium sulfite, potassium sulfite, lithium sulfite, ammonium sulfite, sodium busulfite, potassium metabisulfite, and sodium formaldehydebisulfite. The foregoing sulfite is used in an amount of preferably 0.20 mol/liter or more, more preferably 0.3 mol/liter or more. However, when it is added in an excessively large amount, it possibly may cause silver stain in a developer. Thus, its upper limit is preferably 1.2 mol/liter, particularly preferably from 0.35 mol/liter to 0.7 mol/liter. As a preservative of a dihydroxybenzene-based developing agent, a small amount of ascorbic acid derivative may be used in combination with a sulfite. The ascorbic acid derivative herein includes ascorbic acid, and erysorbic acid which is the steric isomer hereof and an alkali metal salt thereof (sodium, potassium salt). As the foregoing ascorbic acid derivative, sodium erysorbate is preferably used in view of material cost. An addition amount of the foregoing ascorbic acid derivative is preferably from 0.03 to 0.12, particularly preferably from 0.05 to 0.10, in terms of molar ratio, based on a benzene-based developing agent.

When as the foregoing preservative, an ascorbic acid derivative is used, a boron compound is preferably not included in a developer.

As additives usable in a developing agent, in addition to the foregoing compounds, mention may be made of development inhibition agents such as sodium bromide and potassium bromide; organic solvents such as ethylene glycol, diethylene glycol, triethylene glycol and dimethyl formamide; alkanol amines such as diethanol amine and triethanol amine; development accelerators such as imidazole or derivatives thereof; blushing inhibiting agents or black paper inhibiting agents such as mercapto compounds, imidazole compounds, benzotriazole compounds and benzoimidazole compounds.

As the foregoing benzoimidazole compound, specifically mention may be made of 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenztriazole, sodium 4-[2-mercapto-1,3,4-thiaziazole-2-yl]thio]butane sulfonate, 5-amino-1,3,4-thiaziazole-2-thiol, methylbenzotriazole, 5-methylbenzotriazole, 2-mercaptobenzotriazole, and the like. A content of these benzoimidazole compounds is generally from 0.01 mmol to 10 mmol, preferably from 0.1 mmol to 2 mmol per 1 liter of a developer.

Further, in the foregoing developer, various kinds of organic and inorganic chelating agents can be used together. As the foregoing inorganic chelating agent, sodium tetrapolyphosphate, sodium hexametaphosphate, or the like can be used. While, as the foregoing organic chelating agent, mainly an organic carboxylic acid, an aminopolycarboxylic acid, an organic phosphonic acid, an aminophosphonic acid and an organic phosphonocarboxylic acid can be used.

As the foregoing organic carboxylic acid, mention may be made of acrylic acid, oxalic acid, malonic acid, succinic acid, glutaric acid, adipic acid, pimetic acid, azelaic acid, sebacic acid, nonedicarboxylic acid, decanedicarboxylic acid, undecanedicarboxylic acid, maleic acid, itaconic acid, malic acid, citric acid, tartaric acid and the like. However, the organic carboxylic acid is not limited thereto.

As the foregoing aminopolycarboxylic acid, mention may be made of iminodiacetic acid, nitrilotriacetic acid, nitrilotripropionic acid, ethylenediaminemonohydroxyethyltriacetic acid, ethylenediaminetetraacetic acid, glycolethertetraacetic acid, 1,2-diaminopropanetetraacetic acid, diethylenetriaminepentaacetic acid, triethylenetetraaminehexaacenic acid, 1,3-diamino-2-propanol tetraacetic acid, glycoletherdiaminetetraacetic acid, and other compounds described in JP-A-52-25632, JP-A-55-67747, JP-A-57-102624, and JP-B-53-40900.

As the organic phosphonic acid, mention may be made of hydroxyalkilydene-diphosphonic acid described in U.S. Pat. Nos. 3,214,454 and 379459, and West Germany Patent Laid-Open No. 2227639 and the compound described in Research Disclosure, vol. 181, Item 18170, (May 1979).

As the foregoing aminophosphonic acid, mention may be made of aminotris(methylenephosphonic acid), ethylenediaminetetramethylenephosphonic acid, aminotrimethylenephosphonic acid, and the like. Additionally, can be mentioned compounds described in the foregoing Research Disclosure, Item 18170, JP-A-57-208554, JP-A-54-61125, JP-A-55-29883, and JP-A-56-97347.

As the organic phosphonocarboxylic acid, can be mentioned compounds described in JP-A-52-102726, JP-A-53-42730, JP-A-54-121127, JP-A-55-4024, JP-A-55-4025, JP-A-55-126241, JP-A-55-65955, JP-A-55-65956, the foregoing Research Disclosure, Item 18170, and the like. These chelating agents can be used in the form of an alkali metal salt and an ammonium salt.

An addition amount of these chelating compounds is preferably from 1 mol×to $10^{-4}$ mol to 1 mol×to $10^{-1}$ mol and more preferably from 1 mol×to $10^{-3}$ mol to 1 mol×to $10^{-2}$ mol per one liter of a developer.

As the silver stain inhibitor in a developer, can be used compounds described in JP-A-56-24347, JP-B-56-46585, JP-B-62-2849 and JP-A-4-362942. Further, as a dissolution auxiliary agent, the compound described in JP-A-61-267759 can be used. Still her, a developer may also comprise a color toning agent, a surfactant, a deforming agent, a film hardening agent and the like. A temperature and a time in development process are correlated to each other and are determined on the basis of the correlation with a total process time. Generally, however, a developing temperature is preferably about from 20 to about 50° C., more preferably from 25 to 45° C. A development time is preferably from 5 seconds to 2 minutes, more preferably from 7 seconds to 1 minute and 30 seconds.

For the purpose of lowering a transportation cost and a packaging material cost, saving space, and the like, is preferable an embodiment wherein a developer is concentrated and diluted upon use. For concentrating the developer, it is effective that a salt component included in the developer is converted to a potassium salt.

A development process may comprise a processing of fixation for the purpose of removing a silver salt in an unexposed part to achieve stabilization. The processing of fixation can use the techniques in the processing of fixation used for a silver salt photographic film and printing paper, a film for printing plate making, an emulsion mask for photomasking and the like.

As preferable components of a fixing liquid used in the forgoing fixation process, the following compounds can be mentioned. Namely, the fixing liquid preferably includes sodium thiosulfate, ammonium thiosulfate, optionally, tartaric acid, citric acid, gluconic acid, boric acid, iminodiacetic acid, 5-sufosalycylic acid, glucoheptanoic acid, tiron, ethylenediaminetetraacetate, diethylenetriaminepentaacetate, nitrirotriacetate, salts thereof and the like. From the recent standpoint of environmental protection, boric acid is preferably not included. As a fixing agent of a fixing liquid, sodium thiosulfate, ammonium thiosulfate and the like can be mentioned. In view of a fixing rate, ammonium thiosulfate is preferable. From the recent standpoint of environmental protection, however, sodium thiosulfate may be used. Amounts to be used of these known fixing agents can be optionally changed. Generally, however, they are used in an amount of about from 0.1 mol/liter to about 2 mol/liter, particularly preferably from 0.2 mol/liter to 1.5 mol/liter. If desired, the fixing liquid can comprise a film hardening agent (e.g., water-soluble aluminum compound), preservative (e.g., sulfite, bisulfite), pH buffer (e.g., acetic acid), pH regulating agent (e.g., ammonia, sulfuric acid), chelating agent, surfactant, wetting agent and fixing accelerator.

As the foregoing surfactant, for example, mention may be made of anion surfactants such as sulfates and sulfonates, polyethylene-based surfactants and amphoteric surfactants described in JP-A-57-6740. The foregoing fixing liquid may further comprise a known antifoaming agent.

As the foregoing wetting agent, for example, ankanolamines and alkyleneglycols can be mentioned. As the foregoing fixing accelerator, thiourea derivatives described in JP-B-45-35754, JP-B-58-122535 and JP-B-58-122536; an alcohol having a triple bond in its molecule, thioether compounds described in U.S. Pat. No. 4,126,45, mesoionic compounds described in JP-A-4-229860 can be mentioned. The compound described in JP-A-2-44355 also can be used. Further, as the foregoing pH buffer, can be used, for example, organic acids such as acetic acid, malic acid, succinic acid, tartaric acid, citric acid, oxalic acid, maleic acid, glycolic acid, and adipic acid, and inorganic buffers such as boric acid, phosphoric acid and sulfite. As the foregoing pH buffer, preferably, acetic acid, tartaric acid and sulfite are used. The pH buffer is used for the purpose of preventing pH of a fixing agent from elevation due to the incorporation of a developer. It is used in an amount of preferably from 0.01 mol/liter to 1.0 mol/liter, more preferably from 0.02 mol/liter to 0.6 mol/liter. The pH of the fixing liquid is preferably from 4.0 to 6.5, particularly preferably from 4.5 to 6.0. As the foregoing colorant elution accelerator, the compound described in JP-A-64-4739 also can be used.

As the film hardening agent in the fixing liquid, water-soluble aluminum salts and chromium salts can be mentioned.

A preferable compound as the foregoing film hardening agent is a water-soluble aluminum salt such as aluminum chloride, aluminum sulfate or alum. A preferable addition amount of the foregoing film hardening agent is preferably from 0.01 mol/liter to 0.2 mol/liter, more preferably from 0.03 mol/liter to 0.08 mol/liter.

A fixing temperature in the foregoing fixing process is about from 20 to about 50° C., more preferably from 25 to about 45° C. The fixing time is preferably from 5 seconds to 1 minute, more preferably from 7 seconds to 50 seconds. The replenishing amount of the fixing liquid is preferably 600 ml/m$^2$ or less, more preferably 500 ml/m$^2$ or less, and particularly preferably 300 ml/m$^2$ or less based on the processing amount of a photosensitive material.

A photosensitive material having been subjected to development and fixing processing is preferably subjected to a water-washing treatment and a stabilization treatment.

In the foregoing water-washing treatment or stabilization treatment, an amount of water for washing is generally 20 liter or less per m$^2$ of a photosensitive material. Water-washing also can be effected in a replenishing amount of 3 liter or less (including zero, i.e., stored water washing).

Thus, not only saving-water treatment can be effected, but also piping of an automatic processor is not required. As a method for decreasing a replenishing amount of water for washing, a multistage countercurrent system (e.g., 2 stage, 3 stage) has been known since a long time ago. In a case where this multistage countercurrent system is applied, a photosensitive material having been subjected to fixing gradually moves to the normal direction, i.e., sequentially contacted with a processing solution which is still not stained, so that further effective water washing can be achieved. When water washing is effected with a small amount of water, a washing tank such as a squeeze roller or a crossover roller described in JP-A-63-18350 and JP-A-62-287252 is preferably provided. In order to decrease industrial pollution load which is to be a problem in water washing with a small amount of water, addition of various oxidants or a combination of the addition of various oxidants with filtration using fitter can be effected. Further, in the foregoing method, a part or all of liquid overflowed from a water-washing bath or a stabilization bath by replenishing fungusproofing liquid corresponding to a processing can be utilized for a processing liquid having fixing ability in the previous processing step as described in JP-A-60-235133. A water-soluble surfactant or an defoaming agent may be added to water for washing for preventing foaming liable to be generated upon water washing with a small amount of water and/or preventing processed components adhered to a squeeze roller from transferring to a processed film.

In the foregoing water-washing treatment or stabilization treatment, for prevention of staining due to a dye eluted from a photosensitive material, a color adsorbent described in JP-A-63-163456 can be provided in a water washing tank. Further, in the stabilization treatment subsequent to the water washing treatment, bathes described in JP-A-2-201357, 2-132435, 1-102553 and 46-4446 can be used as a final bath of a photosensitive material. In this case, depending upon a necessity, an a onium compound, a metal compound such as Bi or Al, a fluorescent brightener, various chelating agents, a pH regulator, a film hardening agent, a bactericide, a mildew proofing agent, an alkanolamine or a surfactant can be added. As water to be used in a water-washing treatment and a stabilization treatment, tap water, deionized water and water sterilized with a halogen, an ultraviolet sterilization lamp and various kinds of oxidants (ozone, hydrogen peroxide, chlorate and the like) can be preferably used. Further, water for washing comprising the compound described in JP-A-4-39652 or JP-A-5-241309 also can be used. A bath temperature and time in the water-washing treatment or the stabilization treatment is preferably from 0 to 50° and from 5 seconds to 2 minutes, respectively.

A processing liquid such as a developer or a fixing liquid is preferably kept using the packaging material having a low oxygen permeability described in JP-A-61-73147. In a case where an amount of a replenishing liquid is reduced, a contacting area with air in a processing tan is preferably decreased to prevent the liquid from vaporization or air-oxidation. A roller transportation type automatic processor is described in U.S. Pat. Nos. 3,025,779 and 3,545,971. In the present specification, it is simply referred to as a roller transportation type processor. The roller transportation type processor preferably comprises four steps of development, fixation, water-washing and drying. Other steps (e.g., stopping step) are not excluded. However, it is the most preferable to follow these four steps. Four steps can comprise a stabilization step in place of the water-washing step.

In the foregoing each step, components obtained by removing water from a developer or a fixing liquid may be supplied in the form of a solid and dissolved with a given amount of water upon use. A processing agent in such a form is called a solid processing agent. As the solid processing agent, those in the form of powder, tablet, granule, mass or paste are used. The foregoing processing agent preferably has the form described in JP-A-61-259921 or a form of tablet. The tablet can be produced by common methods, for example, described in JP-A-51-61837, JP-A-54-155038 and JP-A-52-88025, U.K. Patent No. 1,213,808, and the like. The granule processing agent can be produced by common methods, for example, described in JP-A-2-109042, JP-A-2-109043, JP-A-3-39735, JP-A-3-39739, and the like. The powder processing agent can be produced by common methods, for example, described in JP-A-54-133332, U.K. Patent Nos. 725,892 and 729,862, German Patent No. 3,733,861, and the like.

A bulk density of the foregoing solid processing agents is, in view of solubility of the processing agents, preferably from 0.5 g/cm$^3$ to 6.0 g/cm$^3$, particularly preferably from 1.0 g/cm$^3$ to 5.0 g/cm$^3$.

In the preparation of the foregoing solid processing agents, a method can be employed wherein at least two kinds of particulate materials which are mutually reactive are each placed in the form of a layer so as to be separated from each other with at least one intervening separation layer comprising an inactive material to the reactive materials, a bag capable of vacuum-packaging is employed as the packaging material of the agents, and the bag is evacuated and sealed. "Inactive" herein means that when materials are physically contacted with each other, they do not cause any reaction under ordinary conditions in a package or even if there is caused any reaction, the reaction is not noticeable. Aside from the fact that an inactive material is inactive to two mutually reactive materials, it is enough that the inactive material is inactive to two reactive materials upon their intended use. Further, the inactive material is used simultaneously with two reactive materials. For example, in a developer, when hydroquinone and sodium hydroxide are directly contacted with each other, they may cause a reaction. Thus, in vacuum packaging, sodium sulfite or the like is used as a separation layer between hydroquinone and sodium hydroxide so that they can be kept in a package for a long period of time. Alternatively, hydroquinone or the like is briquetted to reduce the contacted area with sodium hydroxide, whereby storage stabilities of these compounds are improved and they can be used as a mixture. As the packaging material for the vacuum packaging material, a bag made of an inactive plastic film, plastic material and laminate of a metal foil is used.

A mass of metal silver included in an exposed area after processing is preferably 50% by mass or more, more preferably 80% by mass or more based on the mass of silver included in the exposed area before exposure. When the mass of silver include in the exposed part is 50% by mass or more based on the mass of silver included in the exposed part before exposure, a high conductivity can be preferably obtained.

A tone after development is not particularly limited. However, it preferably exceeds 4.0. When a tone after the development exceeds 4.0, the conductivity of a conductive metal part can be enhanced with keeping transparency in a light transmissive part high. As a means for achieving a tone 4.0 or more, the forgoing doping of rhodium ion or iridium ion can be mentioned.

[Metal Silver Part]

When the film according to the present invention is used as a material of a light-transmitting electromagnetic waveshielding film, a metal silver part is preferably formed on the film, which is consisted of a geometrical configuration comprising a combination of a triangle shape such as equilateral triangle, isosceles triangle and rectangular triangle; a quadrangle such as square, rectangle, rhombus, parallelogram and trapezoid; a regular polygon such as regular hexagon and regular octagon; a circle, an ellipse, and a starburst. More preferably, a metal silver part is patterned in the form of a mesh comprising these geometrical configurations. In view of EMI shield property, triangle shape is most effective. However, in view of visible light transparency, in the same line width, the larger is the number of (n) of a regular poly(n)gon, the larger is an aperture ratio to advantageously provide a large visible light transparency. From the stand point wherein moiré is made to be difficult to be generated, it is also preferable that the geometrical pattern is arranged randomly or a line width is varied without periodicity.

When the film according to the present invention is used as a conductive wiring material, the shape of the foregoing metal silver part is not particularly limited, and an optional shape can be determined corresponding to a use object.

In the use of a light-transmitting electromagnetic waveshielding film, the line width of a silver mesh pattern is preferably from 1 μm to 40 μm, more preferably from 5 μm to 30 μm, and the most preferably from 10 μm to 25 μm. A distance between lines is preferably from 50 μm to 500 μm, more preferably from 200 μm to 400 μm, and the most preferably from 250 μm to 350 μm. A conductive metal part may have a part having a line width of more than 20 μm for the purpose of ground connection or the like.

A silver mesh pattern has an aperture ratio of preferably 85% or more, more preferably 90% or more, and the most preferably 95% or more in view of visible light transmittance. The aperture ratio means a proportion of an area to the total area of a film, which has no fine lines forming a mesh. For example, the aperture ratio of a square lattice mesh having a line width of 15 μm and a pitch of 300 μm is 90%.

A silver mesh pattern is preferably continued for 3 m or more. A larger is a continuous number of a mesh pattern, the smaller is the loss in producing the foregoing optical filter material. Thus, the embodiment having a large continuous number can be said preferable. While, when the continuous number is large, the roll of the film is liable to cause several problems such as adhesion and deformation because of having a large diameter, a heavy weight and a strong pressure in the center part of the roll. Thus, the foregoing length is 2000 m or less, preferably from 100 m to 1000 m, more preferably from 200 m to 800 m, and the most preferably from 3000 m to 500 m.

Based on the similar reason, a support has a thickness of preferably 200 μm or less, more preferably from 20 μm to 180 μm, and the most preferably from 50 μm to 120 μm.

In the present invention, a pattern wherein a mesh is consisted of crossing of a substantially parallel linear thin line means a lattice pattern wherein adjacent lines constituting a lattice is parallel or parallel ±2°.

As a scanning method of the foregoing light beam, is preferably a method comprising exposure with a linear light source arranged substantially vertical direction to a transportation direction or a rotating polygon mirror. In this case, optical beam is required to be subjected to binary or more of intensity-modulation, and a line is patterned as a continuation of dots. Because of the continuation of dots, the edge of a one-dot thin line becomes a step-like. The thickness of the thin line means the narrowest length of the constricted part of the line.

As another system of the foregoing optical beam scanning method, it is also preferable to scan beam of which scanning direction is inclined to the transportation direction corresponding to the inclination of a lattice pattern. In this case, two scanning optical beam is preferably arranged so that they may be mutually perpendicular. The optical beam substantially has a strength of 1 value on the exposed surface.

In the present invention, a mesh pattern is preferably inclined at an angle of preferably from 30 to 60°, more preferably from 40 to 50°, and the most preferably from 43 to 47° to the transportation direction. It is generally difficult to produce a mask wherein a mesh pattern has an inclination of about 45° to a flame, and such mask is liable to cause unevenness and expensive. Contrary to this, according to the system of the present invention, unevenness at around 45° is rather difficult to be generated. Thus, the effect of the present invention is noticeable for photolithography of mask adhesion exposure system and patterning by screen printing.

The thickness of a metal silver part provided on a support prior to plating can be optionally determined corresponding to a coating thickness of a paint for a silver salt-containing layer to be coated on the support. The thickness of a metal silver part is preferably less than 30 μm, more preferably 20 μm or less, further preferably from 0.01 μm to 9 μm, and the most preferably from 0.05 μm to 5 μm. The metal silver part is preferably patterned. The metal silver part can be single layer or can have a multi layer construction comprising two or more layers. When the metal silver part is patterned and has a multi layer construction comprising two or more layers, it can be imparted with various color-sensitivity so that it may be photosensitized at various wavelengths. Thus, when exposure is effected by changing an exposure wavelength, various patterns can be formed in respective layers.

A metal silver part can be formed having a desired thickness by controlling a coating thickness of the foregoing silver salt-containing layer and the thickness of a layer comprising a conductive metal can be freely controlled by the foregoing electroplating processing. Thus, even a light-transmitting electromagnetic wave-shielding film having a thickness of less than 5 μm or less, preferably 3 μm or less can be readily formed.

A conventional method according to etching is required to eliminate and dispose the most part of a metal film by etching. Contrary to this, according to the present invention, a pattern containing only a required amount of a conductive metal can be provided on a support. Therefore, it is enough to use the minimum necessary metal amount, which is advantageous from both aspects of reduction of the production cost and reduction of the amount of metal waste.

[Oxidation Treatment]

In the present invention, an oxidation treatment is preferably applied to a silver mesh pattern after having been subjected to the processing of development or a silver mesh pattern to which plating processing has been applied. According to an oxidation treatment, for example, in a case where a metal is slightly adhered to a light transmitting area other than silver mesh pattern, the metal can be eliminated to achieve substantially 100% transmittance in the light transmitting area.

As the oxidation treatment, mention may be made of a known method using various oxidants, such as Fe(III) ion treatment. As described above, the oxidation treatment can be effected after exposing and developing-processing an emulsion layer or after physical developing or plating processing an emulsion layer. Alternatively, the oxidation treatment can be effected after the processing of development, the physical development or the plating processing, respectively.

In accordance with the present invention, a metal silver part after having been subjected to exposure or developing-processing also can be processed with a Pd-containing solution. Pd can be either divalent palladium ion or metal palladium. According to this processing, electroless plating or physical development speed can be accelerated.

<Light-Transmitting Electromagnetic Wave-Shielding Film>

A practical embodiment of a case where the foregoing light-transmitting conductive film is used as an electromagnetic wave-shielding film will be described below

[Adhesive Layer]

The light-transmitting electromagnetic wave-shielding film according to the present invention is connected through an adhesion layer upon incorporating into an optical filter, a liquid crystal display panel, a plasma display panel, other image-displaying flat panels, or semiconductor integrated circuit for photographing such as CCD.

As an adhesive in an adhesive layer, those having a refraction index of 1.40 to 1.70 are preferably used. This is for preventing visible light transmittance from decreasing by making small the difference of the refraction index of a light-transmitting substrate such as a plastic film to be used in the present invention from that of the adhesive. When the refraction index of the adhesive layer is 1.40 to 1.70, preferably the visible light transmittance is less decreased.

An adhesive is preferably fluidized by heating or pressurizing. Particularly, it is preferably one showing fluidity by heating at 200° C. or less or pressurizing at 1 Kgf/cm$^2$ or more. By using such an adhesive, the light-transmitting electromagnetic wave-shielding film of the present invention wherein a conductive layer is buried in the adhesive layer can be adhered to a display or a plastic plate, which are adherends, by fluidizing the adhesive layer. Because of capable of being fluidized, the light-transmitting electromagnetic wave-shielding film can be readily adhered to an adherend, even to an adherend having a curved surface or a complicated shape, by laminating or pressurizing-molding, particularly pressurizing-molding. In order to achieve the adhesion, an adhesive preferably has a softening temperature of 200° C. or less. Because of a use of a light-transmitting electromagnetic wave-shielding film, an environment in which it is used is generally less than 80° C. Thus, the softening temperature of the adhesive layer is preferably 80° C. or more, and in view of processability, most preferably from 80° C. to 120° C. The softening temperature means a temperature giving a viscosity of $10^{12}$ poise or less. Generally, at such temperature, fluidization is observed in about 1 to 10 seconds.

As an adhesive fluidized by heating or pressurizing as described above, typically the following thermoplastic resins can be mentioned. For example, (di)enes such as natural rubber (refraction index n=10.52), polyisoprene (n=1.521), poly-1,2-butadiene (n=1.50), polyisobutene (n=1.505 to 1.51), polybutene (n=1.513), poly-2-heptyl-1,3-butadiene (n=1.50), poly-2-t-butyl-1,3-butadiene (n=1.506) and poly-1,3-butadiene (n=1.515); polyethers such as polyoxyethylene (n=1.456), polyoxypropylene (n=1.450), polyvinylethylether (n=1.454), polyvinylhexylether (n=1.459) and polyvinylbutylether (n=1.456); polyesters such as polyvinylacetate (n=1.467) and polyvinylpropionate (n=1.467); polyurethane (n=1.5 to 1.6); ethyl cellulose (n=1.479); polyvinyl chloride (n=1.54 to 1.55); polyacrylonitrile (n=1.52); polymethacrylonitrile (n=1.52); polysulfone (n=1.633); polysulfide (n=1.6); phenoxy resin (n=1.5 to 1.6); poly(meth)acrylic acid esters such as polyethyl acrylate (n=1.469), polybutyl acrylate (n=1.466), poly-2-ethylhexyl acrylate (n=1.463), poly-t-butyl acrylate (n=1.464), poly-3-ethoxypropyl acrylate (n=1.465), polyoxycarbonyltetramethylene (n=1.465), polymethyl acrylate (n=1.472 to 1.480), polyisopropyl methacrylate (n=1.473), polydodecyl methacrylate (n=1.474), polytetradecyl methacrylate (n=1.475), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.487), poly-1,1-diethylpropyl methacrylate (n=1.489) and polymethyl methacrylate (n=1.489) can be used. These acrylic polymers can be used by copolymerizing or blending two or more thereof.

Further, as an acrylic resin and a resin copolymerized with a compound other than an acrylic compound, an epoxyacrylate (n=1.48 to 1.60), an urethaneacrylate (n=1.5 to 1.6), a polyetheracrylate (n=1.48 to 1.49), a polyesteracrylate (n=1.48 to 1.54) also can be used. Particularly, from the aspect of adhesion, an urethaneacrylate, an epoxyacrylate and a polyetheracrylate are excellent. As the epoxyacrylate, mention may be made of (meth)acrylic acid adducts, e.g., of 1,6-hexanediol diglycidylether, neopentylglycol diglycidylether, allylalcohol diglycidylether, resolcinol diglycidylether, adipic acid diglycidylester, phthalic acid diglycidylester, polyethyleneglycol diglycidylether, trimethylolpropane triglycidylether, glycerin triglycidylether, pentaerythritol tetraglycidylether, and sorbitol tetraglycidylether. A polymer having a hydroxyl group in the molecule thereof such as a polyepoxy acrylate is effective in improving adhesiveness. These copolymerized resins can be optionally used in combination of two or more thereof. A softening temperature of these polymers to be used as an adhesive is suitably 200° C. or less in view of handling. More preferably, it is 150° C. or less. In view of a use of a light-transmitting electromagnetic wave-shielding film, the film is generally used in an environment having a temperature of 80° C. or less. Thus, a softening temperature of an adhesive layer is most preferably 80° C. to 120° C. in terms of processability.

A polymer having a weight-average molecular weight (determined using a calibration curve of standard polystyrene according to gel permeation chromatography, the same shall apply hereinafter) of 500 or more can be preferably used. When a polymer has a molecular weight of 500 or less, an adhesive composition is to have an excessively low coagulation power to possibly have a decreased adhesion to an adherend. The adhesive to be used in the present invention may optionally comprise additives such as a diluent, a plasticizer, an antioxidant, a filler, a colorant, an ultraviolet absorber, a stickiness imparting agent and the like. A thickness of an adhesive layer is preferably from 10 μm to 80 μm. Particularly preferably, the adhesive layer is thicker than a conductive layer and has a thickness of from 20 μm to 50 μm.

In an adhesive for coating a geometrical pattern, the difference of its refractive index from that of a transparent plastic substrate is to be 0.14 or less. While when a transparent plastic substrate is layered with a conductive material through an adhesion layer, the difference of a refractive index between the adhesion layer and an adhesive for coating a geometrical pattern is to be 0.14 or less. This is because when a refractive index of a transparent plastic substrate is different from that of an adhesive, or a refractive index of an adhesive is different from that of an adhesion layer, visible light transmittance is decreased, and when the forgoing difference is 0.14 or less, visible light transmittance is preferably less decreased. As a material of an adhesive satisfying such requirement in a case where the transparent plastic substrate is polyethylene terephthalate (n=1.575; refractive index), can be used epoxy resins (refractive index; 1.55 to 1.60) such as bisphenol A-type epoxy resin, bisphenol F-type epoxy resin, tetrahydroxyphenylmethane-type epoxy resin, novolak-type epoxy resin, resorcin-type epoxy resin, polyalcohol.polyglycol-type epoxy resin, polyolefin-type epoxy resin, alicyclic or halogenated bisphenol can be used. In addition to epoxy resins, mention may be made of di(ene)s such as natural rubber (n=1.52), polyisoprene (n=1.521), poly 1,2-butadiene (n=1.50), polyisobutene (n=1.505 to 1.51), polybutene (n=1.5125), poly-2-heptyl-1,3-butadiene (n=1.50), poly-2-t-butyl-1,3-butadiene (n=1.506) and poly-1,3-butadiene (n=1.515); polyethers such as polyoxyethylene (n=1.4563), polyoxypropylene (n=1.4495), polyvinylethyl ether (n=1.454); polyvinylhexyl ether (n=1.4591) and polyvinylbutyl ether (n=1.4563); polyesters such as polyvinyl acetate (n=1.4665) and polyvinyl propionate (n=1.4665); polyurethane (n=1.5 to 1.6), ethyl cellulose (n=1.479), polyvinyl chloride (n=1.54 to 1.55), polyacrylonitrile (n=1.52), poly-methacrylonitrile (n=1.52), polysulfone (n=1.633), polysulfide (n=1.6), phenoxy resin (n=1.5 to 1.6), and the like. These resins can realize a suitable visible light transmittance.

While, in a case where the transparent plastic substrate is an acrylic resin, in addition to the foregoing resins, can be used poly(meth)acrylic acid esters such as polyethyl acrylate (n=1.4685), polybutyl acrylate (n=1.466), poly-2-ethylhexyl acrylate (n=1.463), poly-t-butyl acrylate (n=1.4638), poly-3-ethoxypropyl acrylate (n=1.465), polyoxycarbonyltetramethacrylate (n=1.465), polymethyl acrylate (n=1.472 to 1.480), polyisopropyl methacrylate (n=1.4728), polydodecyl methacrylate (n=1.474), polytetradecyl methacrylate (n=1.4746), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.4868), polytetracarbanyl methacrylate, (n=1.4889), poly-1,1-diethylpropyl methacrylate (n=1.4889) and polymethyl methacrylate (n=1.4893). These acrylic polymers can be used by copolymerizing or blending two or more thereof.

Further, as an acrylic resin and a resin copolymerized with a compound other than an acrylic compound, an epoxyacrylate, an urethaneacrylate, a polyetheracrylate, a polyesteracrylate also can be used. Particularly, from the aspect of adhesion, an epoxyacrylate and a polyetheracrylate are excellent. As the epoxyacrylate, mention may be made of (meth) acrylic acid adducts, e.g., of 1,6-hexanediol diglycidylether, neopentylglycol diglycidylether, allylalcohol diglycidylether, resolcinol diglycidylether, adipic acid diglycidylester, phthalic acid diglycidylester, polyethyleneglycol diglycidylether, trimethylolpropane triglycidylether, glycerin triglycidylether, pentaerythritol tetraglycidylether, and sorbitol tetraglycidylether. The epoxyacrylate is effective in improving adhesion because of having a hydroxyl group in the molecule thereof. These copolymerized resins can be optionally used in combination of two or more thereof. A polymer to be a main component of an adhesive has a weight-average molecular weight of 1000 or more. When a polymer has a molecular weight of 1000 or less, an adhesive composition is to have an excessively low coagulation power to possibly have a decreased adhesion to an adherend.

As a hardener of the adhesive, amines such as triethyltetraamine, xylenediamine and diaminodiphenylmethane; acid anhydrides such as phthalic anhydride, maleic anhydride, dodecylsuccinic anhydride, pyromelitic anhydride and benxophenonetetacarboxylic anhydride; diaminodiphenyl sulfone, tris(dimethylaminomethyl)phenol, polyamide resin, dicyandiamide, ethylmethylimidazole and the like can be used. These can be used alone or in any mixture of two or more thereof. These crosslinking agents can be added in an amount of from 0.1 parts by weight to 50 parts by weight, preferably from 1 part by weight to 30 parts by weight. When the crosslinking agent is added in an amount of less than 0.1 parts by weight, an adhesive cannot be sufficiently hardened. While, when it is added in an amount of exceeding 50 parts by weight, it may cause excessive crosslinking to sometimes give an adversely effect on adhesion. The resin composition of the adhesive to be used in the present invention may optionally comprise additives such as a diluent, a plasticizer, an antioxidant, a filler, a stickiness imparting agent and the like. This adhesive resin composition is applied for partially or entirely coating a transparent substrate of a constituting material having a geometrical pattern formed by a conductive material, followed by solvent-drying and thermal curing processing. Finally, the adhesion film according to the present invention can be obtained. The obtained adhesion film having electromagnetic wave-shielding property and transparency obtained in the above is used by directly adhering to a display such as CRT, PDP, liquid crystal or EL with the adhesive of the adhesion film or used by adhering to a plate or a sheet such as an acrylic plate or a glass plate to be used as a display. This adhesion film is used for a window for looking inside a measurement apparatus, a measurement instrument or a manufacturing apparatus, which generate electromagnetic wave, according to the same manner as described above. Further, it is applied to a window of an automobile or a window of a structure likely to be subjected to electromagnetic wave hindrance by a tower, a high-tension cable, or the like. To a geometrical pattern formed by a conductive material is preferably provided with an earth cable.

An area of a transparent plastic substrate from which a conductive material is removed intentionally has irregularities for improving adhesion or transfers its back side shape. Thus, on the surface of the area, light is scattered so that transparency may be lost. However, when a resin having a refractive index similar to that of the transparent plastic substrate is smoothly coated on the irregular surface, scattered refraction can be suppressed as small as possible so that transparency can be exhibited. Further, the geometrical pattern formed by the conductive material on the surface of a transparent plastic substrate has a very small line width and, therefore, cannot be visible with naked eyes. Further, it can be considered that since a pitch is sufficiently large, an apparent transparency can be exhibited. While, the pitch of the geometrical pattern is sufficiently small compared with the wavelength of an electromagnetic wave to be shielded. Thus, it can be considered that excellent shielding property is obtained.

As described in JP-A-2003-188576, lamination of a transparent substrate film with a metal foil can be effected without providing an adhesive layer in a case where as the transparent substrate film, a film of a ethylene-vinyl acetate copolymer resin having a high thermal fusion bonding property or a thermal fusion bonding resin such as an ionomer resin is used alone or used by laminating with other resin films. Generally, however, lamination is effected by a dry-laminating method or the like using an adhesive layer. As the adhesive for constituting the adhesive layer, mention may be made of an acrylic resin, a polyester resin, a polyurethane resin, a polyvinyl alcohol resin, a vinyl chloride/vinyl acetate copolymer resin, an ethylene-vinyl acetate copolymer and the like. Additionally, thermo-setting resins and ionizing radiation-setting resins (ultraviolet curable resin, electron beam curable resin and the like) also can be used.

Generally, the surface of a display is made of glass. Thus, an adhesive adheres a transparent plastic film with a glass plate. When air bubbles are generated between the adhered surfaces or the adhered surfaces are peeled form each other, several problems wherein an image is deformed or an indicated color is differently seen from the normal color of a display may occur. Problems such as the air bubbles and the peeling may occur upon peeling of the adhesive from the plastic film or the glass plate. This phenomenon can possibly occur in either the plastic film side or the glass plate side. The peeling may occur on the side having a weaker adherence. Accordingly, a strong adherence of the adhesive with the plastic film or the glass plate at a high temperature is required. Specifically, the adherence of the adhesive layer with the transparent plastic film or the glass plate is preferably 10 g/cm or more, more preferably 30 g/cm or more at 80° C. Provided that an adhesive having an adherence of over 2000 g/cm is sometimes not preferable because of difficulty in bonding operation. However, when such problem does not occur, such adhesive can be used with no problems. On an area of the adhesive which does not face the transparent plastic film, can also be provided a separator so that the area may not needlessly contact with other areas.

An adhesive is preferably transparent. Specifically, the adhesive has a transmittance of all light of preferably 70% or more, more preferably 80% or more and the most preferably from 85% to 92%. Further, it preferably has a low level of haze. Specifically, the haze is preferably from 0% to 3%, more preferably from 0% to 1.5%. The adhesive to be used in the present invention is preferably colorless so as not to change the normal display color. However, even when the resin itself is colored, in a case where the adhesive is thin, the adhesive substantially can be regarded as colorless. Also in a case where the adhesive is intentionally colored, which will be described later, similarly the adhesive substantially can be regarded as colorless.

As an adhesive having the foregoing properties, for example, mention may be made of an acrylic resin, an α-olefin resin, a vinyl acetate-based resin, an acrylic copolymer-based resin, an urethane-based resin, an epoxy-based resin, vinylidene chloride-based resin, a vinyl chloride-based resin, an ethylene-vinyl acetate-based resin, a polyamide-based resin, a polyester-based resin and the like. Of these, the acrylic-based resin is preferable. Even in a case where the same resin is used, an adhesion can be improved by lowering an addition amount of a crosslinking agent upon synthesizing an adhesive according to a polymerization method, adding a stickiness imparting agent or modifying the terminal group of the molecule of the resin. Further, even by using the same adhesive, a surface to which the adhesive is applied, i.e., the surface of a transparent plastic or the surface of a glass plate can be modified to be able to improve adherence. As such a surface modification method, mention may be made of physical means such as corona discharge treatment and plasma glow treatment, and formation of a prime coat for improving adherence.

In view of transparency, colorlessness and handling, the thickness of an adhesive layer is preferably about from 5 μm to 50 μm. In a case where an adhesive layer is formed with an adhesive, the thickness of the layer had better be thin within the foregoing range. Specifically, the thickness is about from 1 μm to 20 μm. However, the thickness can exceed the foregoing range as long as the inherent indication color of a display is not changed as described above and the transparency resides in the foregoing range.

[Peelable Protecting Film]

The light-transmitting conductive film having been subjected to plating processing of the present invention preferably can be used as a light-transmitting electromagnetic wave-shielding film. The light-transmitting electromagnetic wave-shielding film according to the present invention can be provided with a peelable protecting film.

The protective film is not necessarily provided on both sides of sheet 1 for electromagnetic wave shielding (transmissive electromagnetic wave-shielding film). As shown in FIG. 2(a) of JP-A-2003-188576, protective film 20 is only provided on metal foil 11' of laminate 10 in the form of mesh. The protective film is not required to be provided on the side of transparent substrate film 14. Further, as shown in FIG. 2(b) of the same publication, protective film 30 is only provided on the side of transparent substrate film 14 of laminate 10. The protective film is not required to be provided on metal foil 11'. It should be noted that in FIG. 2 and FIG. 1 of the foregoing publication, parts shown by the same symbols represent the same one.

Next, the layer construction of the laminate constructed by laminating at least transparent substrate film 14 and a transparent electromagnetic wave-shielding layer comprising metal foil 11' in the form of mesh having closely arranged apertures in sheet 1 for electromagnetic wave shielding, and the production process of the laminate will be explained by quoting FIGS. 3(a) to (f) of the foregoing publication. It should be noted that the lamination of protective film 20 and/or protective film 30 will be explained after the explanation of the production process of the laminate.

First of all, as shown in FIG. 3(a) of the foregoing publication, a laminate obtained by laminating transparent substrate film 14 and metal foil 11 via adhesive layer 13 is prepared. As transparent substrate film 14, films of an acrylic resin, a polycarbonate resin, a polypropyrene resin, a polyethylene resin, a polystyrene resin, a polyester resin, a cellulose-based resin, a polysulfone resin, a polyvinyl chloride resin and the like can be used. Generally, a film of a polyester resin such as polyethylene terephthalate resin having an excellent mechanical strength and a high transparency is preferably used.

The thickness of transparent substrate film 14 is not particularly limited. However, from the stand point of obtaining a high mechanical strength and a high bending resistance, the thickness is preferably about from 50 μm to 200 μm. The thickness can be further increased. However, in a case where sheet 1 for electromagnetic wave shielding is used by laminating with another transparent substrate, the transparent substrate film is not necessarily to have a thickness exceeding the foregoing range. Depending upon a necessity, corona discharge treatment can be applied to one surface or both surfaces of transparent substrate film 14. Alternatively, a readily adhering layer can be applied to transparent substrate film 14.

As will be described later by quoting FIG. 4 of the foregoing publication, sheet 1 for electromagnetic wave shielding is used in such a state that a sheet having effects of strengthening the outermost surface, imparting reflection preventive property, imparting antifouling property and the like is layered on both sides of the laminate obtained by laminating the foregoing laminate to a substrate via an infrared ray cutting filter layer. Thus, the foregoing protective film is required to be peeled off upon such additional lamination. Therefore, the lamination of the protective film to the metal foil side is desirably effected in such a manner that the protective film can be peeled off (so-called peelable).

The protective film, upon lamination on the metal foil, has a peeling strength of preferably from 5 mN/25 mm width to 5 N/25 mm width, more preferably from 10 mN/25 mm width to 100 mN/25 mm width. When the peeling strength is less than the lower limit, peeling may occur excessively easily. So the protective film undesirably could be peeled off during handling or by careless contact. While, when the peeling strength exceeds the upper limit, peeling requires a strong force and the metal foil in the form of mesh may possibly peel the transparent substrate film (or the adhesive layer), and, therefore, also undesirable.

In sheet 1 for electromagnetic wave shielding, a protective film laminated to the lower side of a laminate (can comprise a blackened layer) obtained by laminating a mesh-like metal foil on transparent substrate film 14 via adhesive layer 13, namely laminating to the side of the transparent substrate film is provided so that the lower surface of the transparent substrate film may not be damaged during handling or by careless contact. The protective film also functions to protect an exposed surface of the transparent substrate film from polluting or penetrating in each step of providing a resist layer on the metal foil and of etching the resist layer, particularly in the etching step.

As in the foregoing protective film, this protective film is also required to be peeled off upon the additional lamination to the laminate. Thus, it is desirable that the lamination of the protective film to the side of the transparent substrate film is also effected peelably. The peeling strength, as in the foregoing protective film, is preferably from 5 mN/25 mm width to 5 N/25 mm width, more preferably from 10 mN/25 mm width to 100 mN/25 mm width. When the peeling strength is less than the lower limit, peeling may occur excessively easily. So the protective film undesirably could be peeled off during handling or by careless contact. While, when the peeling strength exceeds the upper limit, peeling requires a strong force.

The protective film to be laminated to the side of the transparent substrate film is preferably resistant to the etching conditions. For example, the protective film is preferably not penetrated during soaking in an etching solution having a temperature of about 50° C. for several minutes, particularly not penetrated by an alkaline component of the etching solution. Or in the case of dry etching, it is preferably resistant to temperature conditions of about 100° C. When the laminate is subjected to dip coating (soaking coating) upon laminating a photosensitive resin layer, the coating solution is also adhered to the opposite side of the laminate. Thus, the protective film preferably gives the photosensitive resin an adherence so that the photosensitive resin may not peel off and float in the etching solution during the step of etching or the like. When the etching solution is used, the protective film desirably has a durability resistant to the pollution cause by the etching solution containing iron chloride, copper chloride and the like. Or the protective film desirably has a durability resistant to the penetration or the pollution by a resist remover such as an alkaline solution.

For satisfying the foregoing each point, as the film for constituting the protective film, preferably can be used resin films, e.g., those of polyolefine resins such as polyethylene resins and polypropylene resins; polyester resins such as polyethylene terephthalate resins; polycarbonate resins or acrylic resins. Further, from the foregoing point of view, it is preferable that the outermost surface of a laminate when a protective film is applied to the laminate is at least subjected to corona discharge treatment. Alternatively, at least a readily adhering layer is preferably laminated to the outermost surface.

As the adhesive for constituting the protective film, acrylic ester-based adhesives, rubber-based adhesives or silicone-based adhesives can be used.

The material of the film and the material of the adhesive for the foregoing protective film also can be applied to a protective film to be applied to a metal foil side. Thus, although as both protective films, different films can be used, the same films can be used as both protective films.

<Optical Filter>

The optical filter according to the present invention is a functional film comprising the foregoing light-transmitting electromagnetic wave-shielding film equipped with a composite functional layer.

[Composite Functional Layer]

In a display, the display screen is difficult to be seen by reflection of lightings, etc. Thus, functional film (C) is required to have antireflection (AR) property for suppressing external light reflection, or antiglare (AG) property for preventing reflection of mirror image, or antireflection antiglare (ARAG) property having the foregoing both properties. When the visible light transmittance of an optical filter surface is low, not only reflection can be prevented, but also contrast and the like can be improved.

Functional film (C) having antireflection (AR) property has an antireflection film. Specifically, as functional film (C), mention may be made of a thin film of a fluorine-based transparent polymer resin, magnesium fluoride, a silicon resin or silicon oxide, having a low refractive index of 1.5 or less, preferably 1.4 or less in visible light range, which is formed into a single layer having an optical film thickness of ¼ wavelength; and a thin film of an inorganic compound such as a metal oxide, a fluoride, a silicide, a nitride, a sulfide or the like or an organic compound such as a silicon-based resin, an acrylic resin, a fluorine-based resin, which is layered to a laminate comprising two or more layers. However, functional film (C) is not limited thereto. The surface of functional film (C) having antireflection has visible light reflectance of 2% or less, preferably 1.3% or less, and more preferably 0.8% or less.

Functional film (C) having antiglare property has an antiglare film of which surface has minute irregularity of about from 0.1 μm to 10 μm and which is transparent to visible ray. Specifically, it is formed by dispersing particles of an inorganic compound or an organic compound such as silica, an organic silicon compound, a melamine compound, an acrylic compound or the like in a thermosetting resin or a photocurable resin such as an acryl-based resin, a silicon-based resin, a melamine-based resin, an urethane-based resin, an alkyd-based resin, a fluorine-based resin or the like, then forming the resulting dispersion to an ink, successively coating the ink obtained on a substrate, followed by curing. An average particle size of the particle is from 1 μm to 40 μm. While, antiglare (AG) property also can be obtained by coating the foregoing thermosetting resin or photocurable resin on a substrate then pressing a mold having a desired gloss value or a surface state against the coated substrate, followed by curing. However, the production method is not necessarily limited thereto. Functional film (C) having antiglare property has a haze of from 0.5% to 20%, preferably from 1% to 10%. When the haze is too small, the film is to have an insufficient antiglare property. While, when the haze is too large, transmitted image definition is apt to be deteriorated.

For imparting scratch resistance to an optical filter, it is also preferable that functional film (C) has a hard coating property. As a hard coat film, a thermosetting resin or a photocurable resin such as an acryl-based resin, a silicon-based resin, a melamine-based resin, an urethane-based resin, an alkyd-based resin, a fluorine-based resin or the like can be mentioned. However, the kind and the formation method thereof are not particularly limited. The thickness of these films is about from 1 μm to 50 μm. Functional film (C) having a hard coating property has a surface hardness of at least H, preferably 2H, more preferably 3H or more in terms of the pencil hardness according to JIS(K-5400). When an antireflection film and/or an antiglare film are/is formed on a hard coat film, functional film (C) having scratch resistance, antireflection property and/or antiglare property can be preferably obtained.

To an optical filter, dust is readily adhered due to the charge of static electricity. Thus, when a human body is contacted therewith, the human body can suffer from electroshock due to electric discharge. Thus, antistatic treatment is sometimes required for the optical filter. Accordingly, for providing antistatic ability to the optical filter, functional film (C) may have conductivity. The conductivity required in this case can be around $10^{11}$ Ω/square or less. As a method for imparting conductivity, mention may be made of a method for incorporating an antistatic agent into a film, and a method for forming a conductive layer. As the antistatic agent, specifically, trade name Pellestat (produced by Sanyo Chemical Industries, Ltd.), trade name Electroslipper (produced by Kao Corporation) can be mentioned. As the conductive layer, known transparent conductive films such as ITO and conductive films having conductive ultra fine particles such as ITO ultra fine particles and tin oxide ultra fine particles dispersed therein can be mentioned. It is preferred that a hard coat film, an antireflection filmy, or an antiglare film comprises a conductive film or a conductive fine particle.

In a case where the surface of functional film (C) has antifouling property, it is preferable that dirt of, e.g., fingerprint can be prevented and the adhered dirt can be readily eliminated. As a compound having antifouling property, mention may be made of those having non-wetting property to water and/or fat and oil, such as a fluorine compound and a silicon compound. As a fluorine-based antifouling agent, specifically, the agent having trade name, Oputsuru (produced by Daikin Industries) can be mentioned. As a silicon compound, the compound having trade name, Takata quontum (produced by Nippon Yushi) can be mentioned. When these layers having antifouling property are use for the antireflection film, preferably a reflection film having antifouling property can be obtained.

Functional film (C) preferably has ultraviolet cutting property for the purpose of preventing color and a polymer film from deterioration, which will be described later. Functional film (C) having ultraviolet cutting property can be prepared by a method comprising incorporating an ultraviolet absorber to the foregoing polymer film as describe above or a method of providing a ultraviolet absorbing film to the foregoing polymer film.

When an optical filter is used in an atmosphere having higher temperature and humidity than ordinary temperature and ordinary humidity, a color which will be described later, is deteriorated due to water permeating through the film, water is aggregated in an adhesion material to be used for adhesion or on an adhering interface to cause fogging, an adhesion-imparting agent in the adhesion material causes phase separation due to the inference of water so that it may be deposited possibly to cause fogging. Thus functional film (C) preferably has a gas barrier property. In order to prevent such a color deterioration or fogging, it is essential to prevent penetration of water into a color-including layer or an adhesion layer. Thus, it is appropriate that functional film (C) has a vapor permeability of 10 $g/m^2 \cdot day$ or less, preferably 5 $g/m^2 \cdot day$ or less.

In the present invention, polymer film (A), conductive mesh layer (B), functional film (C) and optionally later-described transparent molded product (E) are adhered each other via an arbitrary adhesion material or adhesives (D1) and (D2), which are transparent to visible ray. As the adhesion material or adhesives (D1) and (D2), specifically mention may be made of an acryl-based adhesive, a silicon-based adhesive, an urethane-based adhesive, a polyvinylbutyral adhesive (PVB), an ethylene-vinyl acetate-based adhesive (EVA) and the like, polyvinyl ether, saturated amorphous polyester, a melamine resin and the like. They can be in the form of sheet or liquid as long as practical adhesion strength can be kept. As the adhesion material, a pressure-sensitive adhesive in the form of sheet can be suitably used. After adhering an adhesion material in the form of sheet or after coating the adhesion material, each member is laminated to be adhered. A liquid adhesive, after coating and adhering, is cured by being allowed to stand at room temperature or thermally cured. As the coating method, bar coating method, reverse coating method, gravure coating method, die coating method, roll coating method and the like can be mentioned. These coating methods are selected by taking a kind, a viscosity, a coating amount and the like of the adhesive into account. The thickness of the coated layer is not particularly limited. However, the thickness is from 0.5 μm to 50 μm, preferably from 1 μm to 30 μm. A surface to be provided with an adhesion material layer, i.e., a surface to be adhered, is preferably improved in wettability by previously adhering a readily adhering layer to the surface or by applying an adhesion treatment for achieving adhesion easily such as corona discharge treatment to the surface. In the present invention, the foregoing adhesion material or adhesive transparent to the foregoing visible ray is referred to as a light-transmitting adhesion material.

In the present invention, when functional film (C) is adhered to conductive mesh layer (B), light-transmitting adhesion material layer (D1) is particularly used. Specific examples of the light-transmitting adhesive material to be used for light-transmitting adhesion material layer (D1) are the same as described above. However, it is essential that the thickness of the layer sufficiently can bury the concave portion of conductive mesh layer (B). When the thickness is much thinner than that of conductive mesh layer (B), the concave portion is not sufficiently buried to form a gap. Thus, air bubbles are included in the concave portion to give a filter for display which has turbidity and is insufficient in translucency. While when the thickness is too thick, several problems may occur, i.e., the production cost of the adhesion material is increased, members are difficult to be handled. The thickness of light-transmitting adhesion material layer (B) is d μm, the thickness of light-transmitting adhesion material layer (D1) is preferably from (d−2) μm to (d+30) μm.

The visible ray transmittance of the optical filter is preferably from 30% to 85%, more preferably from 35% to 70%. When it is less than 30%, the optical filter has excessively decreased brightness to deteriorate visibility. While, when the filter for a display has an excessively high visible ray transmittance, the contrast of the display cannot be improved. It should be noted that the visible ray transmittance in the present invention is calculated according to JIS(R-3106) from the wavelength dependency of the transmittance in the visible ray region.

When functional film (C) is adhered on conductive mesh layer (B) via light-transmitting adhesion material layer (D1), it sometimes may occur that air bubbles are included in the concave portion of the mesh layer to give turbidity causing insufficient translucency. In such a case, when, for example, a pressurizing treatment is applied to functional film, gas incorporated in members upon adhesion is defoamed or formed into a solid solution with the adhesion material to eliminate the turbidity so that the translucency may be improved. The pressurizing treatment can be effected either in the state of the construction comprising (C)/(D1)/(B)/(A) or in the state of the optical filter of the present invention.

As the pressurizing method, a method comprising interposing a laminate between flat plates, followed by pressing, a method comprising passing a laminate between nip rollers with applying pressure, and a method comprising placing a laminate in a pressurized container, followed by pressurizing can be mentioned. However, the pressurizing method is not particularly limited thereto. The method wherein a laminate is pressurized in a pressurized container is preferable, because pressure can be uniformly applied to the entire laminate, i.e., uneven pressurizing can be avoided, and plural laminates can be processed at one time. As a pressurized container, an autoclave can be used.

Regarding the pressurizing condition, higher is the pressure, the larger amount of the incorporated air bubbles can be eliminated and the shorter can be the processing time. However, in view of the pressure resistance of a laminate and the limitation in the pressurizing method in terms of a function of an apparatus, the pressure is about from 0.2 MPA to 2 MPA, preferably from 0.4 MPA to 1.3 MPA. A pressurizing time may vary depending upon pressurizing conditions and is not particularly limited. However, when a pressurizing period is too long, a long time is taken for processing to invite an increase in cost. Thus, the pressurizing period is preferably 6 hours or less under appropriate pressurizing conditions. Particularly, in case of using a pressurizing container, after reaching a setting pressure, the pressure is preferably kept for about from 10 minutes to 3 hours.

Upon pressurizing, it is sometimes preferable to effect heating at the same time. The heating temporary may elevate the fluidity of a light-transmitting adhesion material to readily defoam the incorporated air bubbles or readily to form a solid solution of air bubbles with the adhesion material. The heating condition is about from room temperature to 80° C. due to the thermal resistance of each member constituting the optical filter. However, the heating condition is not particularly limited.

The pressurizing treatment or the pressurizing heating treatment preferably can improve adhesion of respective members, which have been mutually adhered, constituting the optical filter.

The optical filter of the present invention is provided with light-transmitting adhesion material layer (D2) on another main side opposite to the main side on which conductive mesh layer (B) of polymer film (A) is formed. Specific examples of the light-transmitting adhesion material used in light-transmitting adhesion material layer (D2) are as described above and are not particularly limited. The thickness is also not particularly limited. However, it is from 0.5 μm to 50 μm, preferably from 1 μm to 30 μm. The surface on which light-transmitting adhesion material layer (D2) is formed, i.e., the surface with which light-transmitting adhesion material layer (D2) is adhered, is preferably improved in wettability by a treatment for effecting adhesion easily such as coating for ease adhesion or corona discharge treatment.

A mold-releasing film may be provided on light-transmitting adhesion material layer (D2). Namely, the order is functional film (C)/light-transmitting adhesion material layer (D1)/conductive mesh layer (B)/polymer film (A)/light-transmitting adhesion material layer (D2)/mold releasing film.

The mold releasing film is one wherein silicone or the like is coated to a main surface of a polymer film contacting with an adhesion material layer. When the optical filter of the present invention is adhered on the main surface of later-described transparent molded product (E) or a display surface, e.g., a front glass of a plasma display panel, de mold releasing film is stripped off to expose light-transmitting adhesion material layer (D2), thereafter, the optical film is adhered thereto.

The optical filter of the present invention is used for blocking electromagnetic wave mainly generated from various displays. Preferable examples thereof include an optical filter for plasma display.

The plasma display generates strong near infrared ray as described above and, therefore, the filter for the display of the present invention is required to cut not only electromagnetic wave, but also near infrared ray to a level at which substantially no problems may occur. It is necessary that the transmittance in a wavelength region of from 800 nm to 1000 nm is 25% or less, preferably 15% or less, more preferably 10% or less. The optical filter used for plasma display is required to have a transmitted color of neutral gray or blue gray. This is because luminescent characteristics and the contrast of the plasma display are required to be kept or improved, or because white color having slightly higher color density than normal white color is sometimes preferred. A color plasma display is said to have insufficient color reproducibility. It is preferred to selectively reduce unnecessary emission or light from a fluorescent material or a discharged gas, which is the cause of the insufficient color reproducibility. Particularly, the emission spectrum for red color indication shows several emission peaks in a wavelength of about from 580 nm to 700 nm and a relatively strong emission peak in the side of a short wave length may cause a problem of deteriorating red emission to show a poor color purity, i.e., a color close to orange color. These optical characteristics can be controlled by using a colorant. Namely, for cutting infrared ray, a near infrared ray absorber is used, and for reducing unnecessary emission of light, a colorant which can selectively absorb the unnecessary emission of light is used, whereby desired optical characteristics can be obtained. Further, the color tone of the optical filter also can be made appropriate by using a colorant having a suitable absorption in visible light region.

As a method for inclusion of a colorant, one or more method selected from the following can be used. However, the method is not restricted thereto.

(1) A polymer film or a resin plate wherein at least one kind of colorant is kneaded with a transparent resin;

(2) A polymer film or a resin plate produced by dispersing and dissolving at least one kind of colorant in a resin or a resin monomer/a concentrated resin solution of an organic solvent, followed by casting;

(3) A polymer plate or a resin plate to which is coated a paint obtained by adding at least one kind of colorant to a resin binder and an organic solvent; and (4) A transparent adhesion material including at least one kind of colorant.

The term "inclusion" as used herein means not only the inclusion in a layer or an adhesion material such as a substrate or a coating film, but also the coated state on the surface of a substrate or a layer.

The foregoing colorant is a common dye or pigment having a desired absorption wavelength in visible light region or a near infrared ray absorber. The kind of the colorant is not particularly limited. For example, mention may be made of commercially-available organic colorants such as an anthraquinone-based compound, a phthalocyanine-based compound, a methine-based compound, all azomethine-based compound, an oxadine-based compound, an immonium-based compound, an azo-based compound, a styryl-based compound, a qumarine-based compound, a porfirine-based compound, a dibenzofuranone-based compound, a diketopyrroopyrrole-based compound, a rhodamine-based compound, a xanthene-based compound, a pyromethene-based compound, a dithiol-based compound, and a diiminium-based compound. The kind and the concentration of the colorant are determined depending upon the absorption wavelength and the absorption coefficient thereof, transmission properties and transmittance required for an optical filter, and a kind and a thickness of a medium or a coating film in which the colorant is dispersed. The kind and the concentration are not particularly limited.

In a plasma display, the panel surface thereof has a high temperature. When an environmental temperature is high, particularly, the optical filter is to have an increased temperature. Thus, a colorant suitably has such a thermal resistance that it is not noticeably deteriorated by decomposition or the like at 80° C. Besides the thermal resistance, some colorants are poor in the light resistance. When a problem of deterioration of a colorant with emission of light from a plasma display, or with external ultraviolet ray and visible ray arises, it is essential that a member containing an ultraviolet absorber or a member which inhibits ultraviolet ray from transmitting is used to reduce the deterioration of the colorant with ultraviolet ray or that a colorant which is not noticeably deteriorated with ultraviolet ray or visible light ray is used. In addition to heat and light a colorant is required to be resistant to humidity and a composite environment thereof as well. When a colorant is deteriorated, transmission properties of an optical filter are changed to result in the change in color tone or the reduction of blocking ability of near infrared ray. For dispersing a colorant in a medium or a coating film, its solubility or dispersibility in an appropriate solvent is also important. In the present invention, two or more kinds of colorants respectively having a different absorption wavelengths are included in one medium or coating film. Alternatively, two or more kinds of media or coating films each including a colorant may be used.

The foregoing methods (1) to (4) for inclusion of a colorant can be used for the optical filter of the present invention in terms of one or more embodiment selected from polymer film containing a colorant (A), functional film containing a colorant (C), light-transmitting adhesion materials containing a colorant (D1) and (D2), and other light-transmitting adhesion materials or adhesives containing a colorant.

Generally, a colorant is liable to be deteriorated with ultraviolet ray. Ultraviolet ray which is given to an optical filter under normal use conditions is included in external light such as sunlight. Accordingly, for preventing a coloring material from deterioration with ultraviolet ray, at least one layer selected from a layer containing a colorant itself and a layer nearer to a person side than this layer, which receives an external light preferably has an ultraviolet ray cutting ability. For example, in a case where polymer film (A) includes a colorant, if light-transmitting adhesion material layer (D1) and/or functional film (C) comprise(s) an ultraviolet ray absorber or a functional film having an ultraviolet ray cutting ability, the colorant can be protected from ultraviolet ray included in external light. The ultraviolet ray cutting ability required for protecting a colorant means to provide 20% or less, preferably 10% or less and more preferably 10% or less of transmittance in an ultraviolet region having a wavelength shorter than 380 nm. The functional film having an ultraviolet ray cutting ability can be either a coating film having an ultraviolet absorber or an inorganic film which reflects or absorbs ultraviolet ray. As the ultraviolet absorber, those conventionally known such as benzotriazole-based compounds and benzophenone-based compounds can be used. The kind and the concentration of the ultraviolet absorber are determined depending upon its dispersibility and solubility in a medium in which it is to be dispersed or dissolved, its absorption wavelength and absorption coefficient, and a kind and a thickness of a medium. The kind and the concentration are not particularly limited. It should be noted that preferably a layer or a film having ultraviolet ray cutting ability has a small absorption in visible light region so that they do not show noticeable decrease in visible ray transmittance or do not show a color such as yellow. In functional film (C) containing a colorant, when a layer containing the colorant is formed, a film or a functional film, which is located closer to a person side than the foregoing layer, should have an ultraviolet ray cutting ability, while when a polymer film comprises a colorant, a functional film or a functional layer having an ultraviolet ray cutting ability should be provided at a position nearer to a person side than the film.

A colorant can be deteriorated upon contacting with a metal. When such a colorant is used, it is more preferred that the colorant is located so that it may not contact with conductive mesh layer (B) as much as possible.

Specifically, a colorant-containing layer is preferably functional film (C), polymer film (A) or light-transmitting adhesion material layer (D2), particularly light-transmitting adhesion material layer (D2).

The optical filter of the present invention is constructed by polymer film (A), conductive mesh layer (B), functional film (C), light-transmitting adhesion material layer (D1), and light-transmitting adhesion material layer (D2) in the order of (C)/(D1)/(B)/(A)/(D2). Preferably, a conductive mesh film consisting of conductive mesh layer (B) and polymer film (A) is adhered with a functional film with light-transmitting adhesion material layer (D1), and main surface opposite to the side of conductive mesh layer (B) of polymer film (A) is adhered with light-transmitting adhesion material layer (D2).

Upon attaching the optical filter of the present invention to a display, the attachment is effected in such a manner that functional film (C) is positioned at a person side and light-transmitting adhesion material layer (D2) is positioned at the display side.

As a method for using the optical filter of the present invention in such a manner that it is provided in front of the display, a method wherein the optical filter is used as a front filter plate using the later-described transparent molded product (E) as a substrate, and a method wherein the optical filter is adhered on the surface of the display via light-transmitting adhesion material layer (D2) can be mentioned. In the former method, the optical filter can be relatively easily installed, and the mechanical strength of the filter is improved owing to the substrate, which is suitable for the protection of the display. While, in the latter method, since the substrate is not used, the display can be lightened and the thinning of the display can be achieved. Further, the display surface can be suitably prevented from reflection.

As transparent molded product (E), a glass plate and a light-transmitting plastic plate can be mentioned. In view of mechanical strength, lightness, and difficulty in cracking, the plastic plate is preferable. While, in view of thermal stability, i.e., thermal deformation at a small extent, the glass plate also can be suitably used. As the specific examples of the plastic plate, mention may be made of acrylic resins such as polymethyl methacrylate (PMMA), polycarbonate resins and transparent ABS resins. However, the plastic plate is not limited to these resins. Particularly, PMMA can be suitably used because of having a high transparency in a wide wavelength region and a high mechanical strength. The plastic plate has a thickness which can provide sufficient mechanical strength and rigidity capable of keeping flatness without causing bending. The thickness is not particularly limited. However, it is generally about from 1 mm to 10 mm. The glass is preferably a semi-reinforced glass plate or a reinforced glass plate obtained by a chemical reinforcing processing or an air-cooling reinforcing processing for being imparted with mechanical strength. By taking the weight into consideration, the thickness of the glass is preferably about from 1 mm to 4 mm. However, the thickness is not particularly limited. Transparent molded product (E) can be subjected to various known pretreatments prior to being adhered with a film. Alternatively, a part to be the edge part of the optical filter can be provided with a colored (e.g., black) frame printing.

The construction of an optical filter in case of using transparent molded product (E) is in the order of functional film (C)/light-transmitting adhesion material layer (D1)/conductive mesh layer (B)/polymer film (A)/light-transmitting adhesion material layer (D2)/transparent molded product (E). Main surface of transparent molded product (E) opposite to the surface thereof with which light-transmitting adhesion material layer (D2) is adhered can be provided with functional film (C) via a light-transmitting adhesion material layer. In this case, functional film (C) is not required to have the same function and construction with those of functional film (C) provided at a person side. For example, when functional film (C) has a reflection preventive ability, it can reduce the backside reflection of the optical filter having a support. Similarly, main surface of transparent molded product (B) opposite to the surface thereof with which light-transmitting adhesion material layer (D2) is adhered can be provided with functional film (C2) such as a reflection preventive film. In this case, functional film (C2) can be installed in the display so that it may be located at a person side. However, as described above, a layer having an ultraviolet ray cutting ability is preferably provided in a colorant-containing layer or in a layer located nearer to a person side than the colorant-containing layer.

A devices needing electromagnetic wave shielding is required to block electromagnetic wave by providing a metal layer inside the case of the device or using a conductive material for the case. However, in a case where transparency is required in an indication part as in a display, a light-transmitting electromagnetic wave-shielding filter having a conductive layer in the form of a window as in the optical filter of the present invention is installed in the indication part. Electromagnetic wave, after being absorbed in the conductive layer in the electromagnetic wave-shielding filter, induces charge. Thus, if charge is not allowed to be escaped by earthing, the optical filter functions as the antenna again to oscillate electromagnetic wave so that the electromagnetic wave-shielding ability of the device may be decreased. Accordingly, the optical filter is required to be electrically contacted with the earthing part of the display. Therefore, light-transmitting adhesion material layer (D1) and functional film (C) are required to be formed on conductive mesh layer (B) with leaving a conduction part capable of taking external conduction. The shape of the conduction part is not particularly limited. However, it is essential that a gap for leaking electromagnetic wave is not present between the optical filter and the display. Accordingly, the conduction part is suitably continuously provided in the peripheral part of conductive mesh layer (B). That is, the conduction part is preferably provided in the form of a frame in the position other than the central part which is the indication part of a display.

The conduction part can be either a mesh pattern layer or an unpatterned layer such as a metal foil solid layer. However, for desirably electrically contacting with the earthing part of the display, the conduction part is preferably an unpatterned one such as a metal foil solid layer.

In a case where a conduction part is not patterned as in a metal foil solid and/or the mechanical strength of the conduction part is sufficiently high, the conduction part can be suitably used as an electrode as it is.

For protecting a conduction part and/or for desirably electrically contacting with an earthing part in a case where the conduction part is a mesh pattern layer, there can be a case where an electrode is formed in the conduction part. The electrode shape is not particularly limited. However the electrode is preferably formed so as to entirely cover the conduction part.

As a material to be used for the electrode, in view of conductivity, corrosion resistance and adhesion with a transparent conductive film, can be used a paste comprising silver, copper, nickel, aluminum, chromium, iron, zinc, carbon or the like alone; an alloy comprising two or more kinds of these metals; a mixture of a synthetic resin with one of these metals or with an alloy thereof; or a mixture of borosilicate glass with one of these metals or with an alloy thereof. For printing or coating the paste, conventionally known methods can be adopted. While, commercially available conductive tapes also can be suitably used therefor. The conductive tape has conductivity in its both sides. One surface adhesion type and both surfaces adhesion type of a carbon-dispersed conductive adhesive can be suitably used. The thickness of an electrode also is not particularly limited. However, it is around from several km to several mm.

According to the optical filter as described above, can be obtained an optical filter excellent in optical properties which can keep or improve an image quality without noticeably impairing luminescence of a plasma display. While can be obtained an optical filter which is excellent in shielding ability of electromagnetic wave, which is pointed out to have a possibility to adversely affect the health, generated from a plasma display, and does not adversely affect a wavelength used by a remote control of a periphery electronic device or a transmission type optical network and can prevent bungle thereof because of effectively capable of cutting near infrared ray at a wavelength of around from 800 nm to 1000 nm radiated from a plasma display. Further, an optical filter excellent in weatherability also can be provided at a low cost.

EXAMPLE

The present invention will be further described in detail by way of Examples. It should be noted that the material, the use amount, the proportion, the processing content, the processing procedure and the like can be optionally modified unless the gist of the present invention is not deviated. Accordingly, the scope of the present invention should not be limitedly construed by the specific examples given below.

Example 1

Silver Halide Photosensitive Material

Was prepared an emulsion containing silver iodobromochloride particles (I=0.2 mol %, Br=40 mol %) having an average particle size in terms of sphere diameter of 0.1 μm and 10.0 g of gelatin based on 60 g of Ag in an aqueous medium. $K_3Rh_2Br_9$ and $K_2IrCl_6$ were added to the emulsion prepared so as to give the concentration of $10^{-7}$ (mol/mol silver) whereby Rh ion and Ir ion were doped to silver bromide particles. Further, $Na_2PdCl_4$ was added thereto, followed by effecting gold-sulfur sensitization using chloroaulic acid and sodium thiosulfate. Thereafter, the resulting product was coated on a support comprising polyethylene terephthalate (PET) together with a gelatin film hardener so that the coated amount of silver may be 1 g/m². In this case, the volume ratio of Ag/gelatin was 1/2 and the thickness of PET support was 75 μm.

A coating was effected at the width of 25 cm and the length of 20 m on the PET support having the width of 30 cm and the both ends were cut off in the length of each 3 cm with leaving the central coated part in the width of 24 cm to obtain a silver halide photosensitive material in the form of roll.

(Exposure)

The exposure of the silver halide photosensitive material was effected using the continuous exposure device described in the "Mode for Carrying Out the Invention" of JP-A-2004-1244 wherein exposure heads each using a digital mirror device (DMD) were disposed to give the width of 25 cm, the exposure head and an exposure stage were arranged to be curved so that an image was formed with laser beam on the photosensitive layer of the photosensitive material, a delivery mechanism and a take-up mechanism of the photosensitive material were attached, and a deflection having a buffer function was provided so that the rate in the exposure part was not affected by the tension control in the exposure surface and the fluctuation in the speed of the delivery mechanism and the take-up mechanism. In the exposure, the wavelength was 400 nm, the beam form was substantially a square of 12 μm, and the output of a laser beam source was 100 μJ.

The pattern of the exposure was such that 12 μm pixels in a lattice pattern at the angle of 45° and at the pitch of 300 μm were continued in the width of 24 cm and the length of 10 m. The copper pattern after plating processing, which will be described later, was confirmed to have the line width of 12 μm and the pitch of 300 μm.

(Processing of Development)

| Formula of developer 1 liter (replenishing liquid also has the same composition) | |
|---|---|
| Hydroquinone | 27 g |
| Sodium sulfite | 50 g |
| Potassium carbonate | 40 g |
| Ethylenediamine tetraacetate | 2 g |
| Potassium bromide | 3 g |
| Polyethylene glycol 2000 | 1 g |
| Potassium hydroxide | 4 g |
| pH | adjusted to 10.3 |

| Formula of developer 1 liter (replenishing liquid also has the same composition) | |
|---|---|
| Ammonium thiosulfate (75%) | 300 ml |
| Ammonium sulfite monohydrate | 25 g |
| 1,3-diaminopropane tetraacetate | 8 g |
| Acetic acid | 5 g |
| Aqueous ammonia (27%) | 1 g |
| pH | adjusted to 6.2 |

The photosensitive material, which had been exposed using the foregoing processing agent, was processed using the automatic film developing device FG-710PTS produced by Fuji photo film Co. Ltd. for 20 seconds under the processing conditions: development 30° C., 30 seconds; fixation 30° C., 23 seconds; water washing, running water (5 L/min.) for 20 seconds.

The running conditions were as follows. A processing amount of a photosensitive material was 100 m²/day, replenishing of a developer was 500 ml/m², and a fixing solution was 640 ml/m², and a term of 3 days.

As described above, the film wherein on a transparent film a lattice-shaped silver mesh pattern was formed. The surface resistivity of this film was 50.52Ω/square.

(Plating Processing)

Plating processing was applied using the electroplating apparatus equipped with electroplating tank 10 shown in FIG. 1 to the film on which the silver mesh pattern was formed by the foregoing processing. The foregoing photosensitive material was attached to the electroplating apparatus in such a manner that the silver mesh surface of the material may be faced to downwards (silver mesh surface may be contacted with the feeder roller).

As feeder rollers 12a, 12b, those obtained by applying 0.1 mm thick-electrical copper plating to a surface of a mirror-finished stainless roller (10 cmØ, length 70 cm) were used. As guide roller 14 and other transporting rollers, rollers (5 cmØ, length 70 cm) to which copper plating had not been applied were used. By controlling the height of guide roller 14, a constant processing time in a liquid could be kept even if the line speeds were differed.

The distance between the lowest part of an area where the feeder roller 12a in the inlet side was contacted with the silver mesh surface and the plating liquid surface (distance La shown in FIG. 1) was 10 cm. While, the distance between the lowest part of an area where the feeder roller in the outlet side was contacted with the silver mesh portion of the photosensitive material and the plating liquid surface (distance Lb shown in FIG. 1) was 20 cm.

The composition of the processing solution, immersion processing time in each bath (period of staying in the solution) and applied voltage in each plating bath in the plating processing were as follows. It should be noted that the temperatures of the processing solution and the water-washing were all 25° C.

| Composition of electrolytic copper plating solution (replenishing liquid also has the same composition) | |
|---|---|
| Copper sulfate pentahydrate | 75 g |
| Sulfuric acid | 190 g |
| Hydrochloric acid (35%) | 0.06 ml |
| Copper Gleam PCM (produced by Rohm and Haas electronic material Co., Ltd.) | 5 ml |
| pure water | added to 1 l |

| Processing time of plating bath and applied voltage | |
|---|---|
| Water washing | 1 minute |
| Acid washing | 30 seconds |
| Plating 1 | 30 seconds, voltage 20 V |
| Plating 2 | 30 seconds, voltage 20 V |
| Plating 3 | 30 seconds, voltage 20 V |
| Plating 4 | 30 seconds, voltage 15 V |
| Plating 5 | 30 seconds, voltage 15 V |
| Plating 6 | 30 seconds, voltage 10 V |
| Plating 7 | 30 seconds, voltage 10 V |
| Plating 8 | 30 seconds, voltage 10 V |
| Plating 9 | 30 seconds, voltage 5 V |
| Plating 10 | 30 seconds, voltage 5 V |
| Water washing | 1 minute |
| Rust prevention | 30 seconds |
| Water washing | 1 minute |

After each processing of plating 1 to plating 9, water washing process with tap water (flow rate 3 l/min.) was applied to the film for 30 seconds, followed by drying with an electro-thermal hot air heater to reduce the water content of the film to 1 ml/m².

The film sample was processed at the length of 10 m by 10 m, and the surface resistivity of the mesh surface after processing was measured. The measurement of the surface resistivity was effected by means of Loresta GP (Model MCP-T610) four-point probe (ASP) connected in series manufactured by DIA Instrument Co. Ltd. Arbitrary fifty points except for each 50 cm of the first part and the end part were measured and the values obtained were averaged. The surface resistivity of each film obtained by changing the line speed are shown in Table 1.

Plating unevenness was visually evaluated. The criteria of the plating unevenness evaluation are as follows.

1: substantially no evenness

2: less than 20% of the unevenness of the entire surface

3: from 20% to less than 80% of the unevenness of the entire surface

4: 80% or more of the unevenness of the entire surface

TABLE 1

| Sample No. | Line speed (m/minute) | Surface resistivity (Ω/square) | Plating unevenness | Note |
|---|---|---|---|---|
| 1 | 0.5 | 8.50 | 4 | Comparative Example |
| 2 | 1 | 2.00 | 2 | Invention |
| 3 | 2 | 0.20 | 1 | Invention |
| 4 | 5 | 0.30 | 1 | Invention |
| 5 | 10 | 3.40 | 1 | Invention |
| 6 | 30 | 10.01 | 1 | Invention |
| 7 | 40 | 50.15 | —* | Comparative Example |
| 8 | unprocessed | 50.52 | — | Reference Example |

*no plating

Comparative Example 1

The silver mesh film having been subjected to the foregoing development processing was cut to the size of 25 cm×25 cm, and an electrode made of copper was attached on one side thereof, which was immersed in the foregoing plating solution for 3 minutes, which was immersed in the foregoing plating solution for 3 minutes and the voltage of 10 V was applied thereto to effect copper plating. The distance between the electrode and the surface of the plating solution was 10 cm. The surface resistivity of the film after plating was determined and visually evaluated as described above. As a result, it could be observed that in the film piece immersed in the plating solution, plating was achieve from a part nearest to the liquid surface to the width of about 2 cm. The film piece therebelow was not plated at all.

Example 2

A sample obtained by copper-sputtering was applied to the same PET film as that of Example 1 to reduce the surface resistivity to 50Ω/square was used instead of the photosensitive material in Example 1 and the same experiment as in Example 1 was effected. As a result, under the conditions of sample No. 3, the surface hardness of the sample was 1.5Ω/square and, therefore, it could be seen that the embodiment of Example 1 (silver mesh) was preferable.

Example 3

The same plating processing was effected as in Example 1 except for preparing a sample having a width of 67 cm in place of 24 cm width. As a result, a similar result to that of Example 1 was obtained.

Example 4

A sample was prepared according to the same manner as in the foregoing Example 3 except that a biaxially oriented polyethylene terephthalate (hereinafter referred to as PET) (thickness 100 μm) was used. Then the resulting sample was processed with a copper blackening processing solution to blacken the surface. The copper blackening processing solution used was commercially available copper black (Isolate Chemical Laboratory Co., Ltd.). A protective film having the total thickness of 28 μm (produced by Panac Industry Co., Ltd.; product number HT-25) was adhered to the PET side by means of a laminator roller.

While a protective film having the total thickness of 65 μm wherein an acryl-based adhesive layer was layered to a polyethylene film (produced by Sanei Kaken Co., Ltd.; product name Sanitect Y-26F) was adhered to the side of the electromagnetic wave-shielding film (metal mesh) by means of a laminator roller.

Then, PET surface was adhered to a glass plate having the thickness of 2.5 mm and the outside dimension of 950 mm×550 mm via a transparent acryl-based adhesion material Successively, on the foregoing conductive mesh layer excluding 20 mm of the outer edge was adhered a 100 μm-thick PET film, a reflection prevention layer, and a near-infrared ray absorbing film having a reflection prevention function which is consisted of a near-infrared ray absorber-containing layer (trade name Clearas AR/NIR produced by Sumito Osaka Cement Co., Ltd.), via a 25 μm-thick acryl-based light-transmitting adhesion material. In the foregoing acryl-based light-transmitting adhesion material layer was included a toning colorant (PS-Red-G, PS-Violet-RC produced by Mitsui Kagaku) for controlling transmission properties of the filter for a display. Further, to the opposite main surface of the foregoing glass plate was adhered a reflection prevention film (trade name ReaLook 8201 produced by Nippon Yushi Co., Ltd.) via an adhesion material. Thus, an optical filter was produced.

The optical filter thus obtained was produced by using an electromagnetic wave-shielding film having a protective film and, therefore, had an extremely low level of scratches and defects of a metal mesh. Further, the metal mesh was black and, therefore, the display image was never tinged with a metal color. The optical filter had an electromagnetic wave-shielding ability at a level of substantially causing no practical problems and a near-infrared ray cutting ability (transmittance of 15% or less at a wavelength of from 300 nm to 800 nm) and was excellent in visibility because of having reflection prevention layers at both sides. The optical filter was imparted with toning function by being incorporated with a colorant. Thus, it can be suitably used as an optical filter for a plasma display or the like.

Reference Example 1

In sample No. 3 of Example 1, the water-washing step and the drying step after plating 1 to plating 3 were not effected and in other steps, the same plating processing was effected as in Example 1.

The surface resistivity was 0.45Ω/square. The level of the plating unevenness was worsened by 1 and the plating unevenness became 2.

The present invention has been described in detail by referring to specified embodiments. However, it is apparent to a person skilled in the art that various changes and modification can be effected without deviating the spirit and scope of the present invention.

The present application was based on Japanese Patent Application filed on Mar. 15, 2005 (Japanese Patent Application 2005-073554) and the content thereof is incorporated herein as reference.

INDUSTRIAL APPLICABILITY

According to the plating processing method of the present invention, plating can be uniformly applied to the front of a film effectively only by an electroplating. Thus, can be provided a light-transmitting conductive film and light-transmitting electromagnetic wave-shielding film, which are uniformly plated, at a high productivity.

The invention claimed is:

1. A plating processing method, which comprises:
   continuously electroplating a surface of a film having a surface resistivity of from 1Ω/square to 1000Ω/square, while transporting the film,
   wherein:
   the transportation speed of the film is from 1 m/minute to 30 m/minute;
   a plurality of plating tanks are present, and the method further comprises applying a washing process and a water-elimination process to the film subsequent to completion of the processing in each plating tank and before processing in any adjacent downstream plating tank;
   the remaining water content after eliminating water in the water elimination process is 5 ml/m² or less;
   each of the plurality of plating tanks comprises:
   a plating bath for storing plating liquid; and
   a feeder roller provided in an inlet side of the plating tank, and the feeder roller guides the film to the plating bath,
   wherein the distance between the lowest contacting part of the feeder roller in the inlet side with the film and the plating liquid is from 0.5 cm to 15 cm;
   each of the plurality of plating tanks further comprises:
   a feeder roller provided in an outlet side;
   a liquid elimination roller rotatably disposed below the feeder roller in an outlet side; and
   a spray for water washing for eliminating plating liquid from the film, the spray being disposed between the liquid elimination roller and the feeder roller in an outlet side; and
   a voltage of from 1 to 100 V is applied to each of the plating tanks, and an amount of electric current on an inlet side of the first tank is from 1 A to 30 A.

2. The plating processing method according to claim 1, wherein the film is patterned with a silver mesh.

3. The plating processing method according to claim 2, wherein the silver mesh is formed by a developed silver.

4. The plating processing method according to claim 2, wherein the silver mesh comprises a water-soluble binder polymer.

5. The plating processing method according to claim 1, wherein the number of the plating tanks is from 2 to 10.

6. The plating processing method according to claim 1, wherein the applied voltage is from 2 V to 60 V.

7. The plating processing method according to claim 1, wherein the electric current on the inlet side of the first tank is from 2 A to 10 A.

8. The plating processing method according to claim 1, wherein the film has a surface resistivity of from 10Ω/square to 100Ω/square.

9. The plating processing method according to claim 1, wherein the transportation speed of the film is from 2 m/minute to 10 m/minute.

10. A method for producing a conductive film, which comprises:
    exposing and developing a photosensitive material having a silver salt-containing layer containing a silver salt on a support, so as to obtain a film on which a metal silver part is formed; and
    continuously electroplating the metal silver part of the film, while transporting the film,
    wherein:
    the transportation speed of the film is from 1 m/minute to 30 m/minute;

a plurality of plating tanks are present, and the method further comprises applying a washing process and a water-elimination process to the film subsequent to completion of the processing in each plating tank and before processing in any adjacent downstream plating tank;

the remaining water content after eliminating water in the water elimination process is 5 ml/m² or less;

each of the plurality of plating tanks comprises:
   a plating bath for storing plating liquid; and
   a feeder roller provided in an inlet side of the plating tank, and the feeder roller guides the film to the plating bath, wherein the distance between the lowest contacting part of the feeder roller in the inlet side with the film and the plating liquid is from 0.5 cm to 15 cm, each of the plurality of plating tanks further comprises:
   a feeder roller provided in an outlet side;
   a liquid elimination roller rotatably disposed below the feeder roller in an outlet side; and
   a spray for water washing for eliminating plating liquid from the film, the spray being disposed between the liquid elimination roller and the feeder roller in an outlet side; and a voltage of from 1 to 100 V is applied to each of the plating tanks, and an amount of electric current on an inlet side of the first tank is from 1 A to 30 A.

11. The method for producing a conductive film according to claim 10, wherein the transportation speed of the film is from 2 m/minute to 10 m/minute.

12. The method for producing a conductive film according to claim 10, wherein the number of the plating tanks is from 2 to 10.

13. The method for producing a conductive film according to claim 10, wherein the applied voltage is from 2 V to 60 V.

14. The method for producing a conductive film according to claim 10, wherein the electric current on the inlet side of the first tank is from 2 A to 10 A.

15. The method for producing a conductive film according to claim 10, wherein the film has a surface resistivity of from 10Ω/square to 100Ω/square.

16. The method for producing a conductive film according to claim 10, wherein the silver salt-containing layer and the metal silver part comprise a water-soluble binder polymer.

\* \* \* \* \*